US012791602B2

(12) United States Patent
Ganai

(10) Patent No.: US 12,791,602 B2
(45) Date of Patent: Nov. 10, 2026

(54) BIAS CAUSE REDUCTION FOR LOCALIZING CONSTRAINTS

(71) Applicant: Synopsys, Inc., Sunnyvale, CA (US)

(72) Inventor: Malay Ganai, San Jose, CA (US)

(73) Assignee: SYNOPSYS, INC., Sunnyvale, CA (US)

( * ) Notice: Subject to any disclaimer, the term of this patent is extended or adjusted under 35 U.S.C. 154(b) by 746 days.

(21) Appl. No.: 18/358,353

(22) Filed: Jul. 25, 2023

(65) Prior Publication Data

US 2025/0035697 A1 Jan. 30, 2025

(51) Int. Cl.
*G01R 31/28* (2006.01)

(52) U.S. Cl.
CPC ................................ *G01R 31/2803* (2013.01)

(58) Field of Classification Search
CPC ........................... G01R 31/28; G01R 31/2803; G01R 31/2815; G01R 31/2834; G01R 31/2848; G01R 31/2851; G06F 30/33; G06F 30/333; G06F 30/3308; G06F 30/367; G06F 30/398
USPC .......................................................... 716/136
See application file for complete search history.

(56) References Cited

U.S. PATENT DOCUMENTS

2005/0268265 A1* 12/2005 Ly ........................... G06F 30/33 716/108
2023/0315960 A1* 10/2023 Wang .................... G06F 30/333 716/136

OTHER PUBLICATIONS

Verdi Regression Debug Automation RDA, https://www.synopsys.com/verification/debug/verdi-rda-debug.html, last accessed Jul. 25, 2023.

(Continued)

*Primary Examiner* — Paul Dinh
(74) *Attorney, Agent, or Firm* — Womble Bond Dickinson (US) LLP

(57) ABSTRACT

In an example, a control binary sequence (CBS) determined during simulating a design under test (DUT) is obtained. Simulating included using a constraint random stimulus generator (CRSG) biased by a coverage biaser. The CBS includes first enabled bits that correspond to respective constraint problems solved by the CRSG and biased by the coverage biaser and from which a designated message was triggered during the simulating. A reduced CBS that has second enabled bits that are a subset of the first enabled bits is constructed. A simulation result generated by re-simulating the DUT is obtained. Re-simulating includes selectively, for each constraint problem, restoring solving steps of the CRSG that were performed during the simulating when a corresponding bit of the reduced CBS is an enabled bit. The reduced CBS is assigned as a triggering CBS that triggered the designated message when the simulation result includes the designated message.

20 Claims, 12 Drawing Sheets

(56) References Cited

OTHER PUBLICATIONS

Murphy, B., Intelligently Optimizing Constrained Random, https://semiwiki.com/artificial-intelligence/314806-intelligently-optimizing-constrained-random/, dated Jul. 12, 2022, last accessed Jul. 25, 2023.

Delta Debugging, Wikipedia, https://en.wikipedia.org/wiki/Delta_debugging, last accessed Jul. 25, 2023.

OpenTitan Issue 16681, "[Assert Failed] ReqHighUntilAck_A for kmac test," https://github.com/lowRISC/opentitan/issues/16681, last accessed Jul. 25, 2023.

OpenTitan Issue 16750, "aon_timer HungHandShake_A assert failure," https://github.com/lowRISC/opentitan/issues/16750, last accessed Jul. 25, 2023.

* cited by examiner

```
201  environment [compile];
202  simv [runtime] <enable_cb>;
203  repeat {
204      simv [runtime] <enable_cb_rerun>;
205      +ntb_solver_bias_debug_record=<DBG>;
206      +ntb_solver_bias_debug_regex=<DesMsg>;
207  } until (<DBG>/dbg.status = DONE or <threshold>)
```

FIG. 2

```
bsr(){
    read ta;
    j=0;
    k=N-1;
    psi = {};

    while (true) {
        if(psi!={})
            tp=constructTp(psi, null, null);
            if(rerunSim(tp)==<)==<DesMsg> )
                ta=tp;
                break;
        k = bsrUpper(j, k, k, j);
        j = bsrLower(j, k, j, k);
        psi = psi + j + k; // union of psi, j, and k collected into psi
        if (j == k or j == k-1) break;
        k--;
        j++;
    }
    write ta;
}
```

FIG. 5A

```
constructTp(psi, range_lower, range_upper) {
    // construct tp from ta such that enable bits with respective indexes
    // in psi and within range from range_lower to range_upper are equal to corresponding
    // bits in ta and other enable bits are disabled
    tp = {0, 0, 0, . . . 0}; // tp[i] = 0 for i=0 to i=N-1
    tp[psi[]]=ta[psi[]] for all elements in psi;
    if (range_lower != null & range_upper != null)
                for(int i=range_lower; i<=range_upper; i++){
                            tp[i]=ta[i];
                }
    return tp;
}

rerunSim(tp) {
    if tp has a previously cached simulation result;
            return cached simulation result;
    restore state of random number generator;
    simulate DUT based on tp;
    return simulation result;
}
```

FIG. 5B

```
bsrUpper(lower_check, upper_check, last_check, j) {
        if(lower_check > upper_check)
                return last_check;
        next_check = roundDown((lower_check+upper_check)/2);
        tp=constructTp(psi, j, next_check);
        if(rerunSim(tp)==<DesMsg>) // rerunSim returns simulation result from re-run of simulation based on tp
                ta=tp;
                return bsrUpper(lower_check, next_check-1, next_check, j);
        else
                return bsrUpper(next_check+1, upper_check, last_check, j);
}

bsrLower(lower_check, upper_check, last_check, k) {
        if(lower_check > upper_check)
                return last_check;
        next_check= roundDown((lower_check+upper_check)/2);
        tp=constructTp(psi, next_check, k);
        if(rerunSim(tp)==<DesMsg>) // rerunSim returns message result from re-run of simulation based on tp
                ta=tp;
                return bsrLower(next_check+1, upper_check, next_check, k);
        else
                return bsrLower(lower_check, next_check-1, last_check, k);
}
```

FIG. 5C

BIAS CAUSE REDUCTION FOR LOCALIZING CONSTRAINTS

TECHNICAL FIELD

The present disclosure relates to functional verification of a design of a circuit, and more particularly, to localizing constraints that may trigger a designated message during simulation of the design.

BACKGROUND

Designing a circuit may be an arduous process, particularly for today's complex System-on-Chip (SoC) circuits. The design is commonly thoroughly tested to ensure functionality, specifications, and reliability. The importance of these tests prior to tape out and fabrication is significant as the costs and complexity of tape out and fabrication is substantial. Fabricating a circuit that does not meet the necessary specification, does not operate as intended, and/or is not reliable may result in large wasted costs.

SUMMARY

An example is a method. A control binary sequence that was determined during simulating a design under test (DUT) is obtained. Simulating the DUT was based on using a constraint random stimulus generator and a coverage biaser biasing the constraint random stimulus generator. The control binary sequence includes first enabled bits that correspond to respective constraint problems solved by the constraint random stimulus generator and biased by the coverage biaser and from which a designated message was triggered during the simulating the DUT. A reduced control binary sequence that has second enabled bits that are a subset of the first enabled bits is constructed by one or more processors. A simulation result generated by re-simulating the DUT is obtained. Re-simulating the DUT includes selectively, for each constraint problem of the constraint problems, restoring solving steps of the constraint random stimulus generator for the respective constraint problem that were performed during the simulating the DUT when a corresponding bit of the reduced control binary sequence is an enabled bit of the second enabled bits. Whether the simulation result includes the designated message is determined. The reduced control binary sequence is assigned as a triggering control binary sequence that triggered the designated message when the simulation result includes the designated message.

Another example is a non-transitory computer-readable medium. The non-transitory computer-readable medium includes stored instructions. The instructions, which when executed by one or more processors, cause the one or more processors to: obtain a control binary sequence that was determined during simulating a design under test (DUT), construct a reduced control binary sequence, obtain a simulation result generated by re-simulating the DUT, determine whether the simulation result includes a designated message, and assign the reduced control binary sequence as a triggering control binary sequence that triggered the designated message when the simulation result includes the designated message. Simulating the DUT was based on using a constraint random stimulus generator and a coverage biaser biasing the constraint random stimulus generator. The control binary sequence includes first enabled bits that correspond to respective constraint problems solved by the constraint random stimulus generator and biased by the coverage biaser and from which a designated message was triggered during the simulating the DUT. The reduced control binary sequence has second enabled bits that are a subset of the first enabled bits. Re-simulating the DUT includes selectively, for each constraint problem of the constraint problems, restoring solving steps of the constraint random stimulus generator for the respective constraint problem that were performed during the simulating the DUT when a corresponding bit of the reduced control binary sequence is an enabled bit of the second enabled bits.

A further example is a non-transitory computer-readable medium. The non-transitory computer-readable medium includes stored instructions. The instructions, which when executed by one or more processors, cause the one or more processors to: obtain an original control binary sequence that was generated during simulating a design under test (DUT); initiate an index range with an upper index and a lower index; and iteratively until (A) an index set is determined such that re-simulating the DUT based on a reduced control binary sequence triggers the designated message, or (B) a termination condition is reached: determine a lowest upper index in the index range and a highest lower index in the index range, collect the lowest upper index and the highest lower index in the index set, and set the upper index to be one less than the lowest upper index and the lower index to be one more than the highest lower index. Simulating the DUT was based on stimulus values generated using a constraint random stimulus generator and a coverage biaser biasing the constraint random stimulus generator. Simulating the DUT generates the original control binary sequence. The original control binary sequence includes first enabled bits that correspond to respective constraint problems solved by the constraint random stimulus generator and from which a designated message was triggered during the simulating the DUT. The reduced control binary sequence has second enabled bits, and each enabled bit of the second enabled bits corresponds to a respective enabled bit of the first enabled bits at a respective index in the index set. In an iteration, the designated message is triggered by a re-simulation of the DUT based on a first control binary sequence. The first control binary sequence has third enabled bits, and each enabled bit of the third enabled bits corresponds to a respective enabled bit of the first enabled bits at a respective index in the index set or at a respective index in a range from the highest lower index to the lowest upper index.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 2 is pseudocode of a use model for implementing a constraint debugger of FIG. 1 according to some examples.

FIGS. 5A, 5B, and 5C are pseudocode for determining a triggering control binary sequence according to some examples.

DETAILED DESCRIPTION

Figure 1:
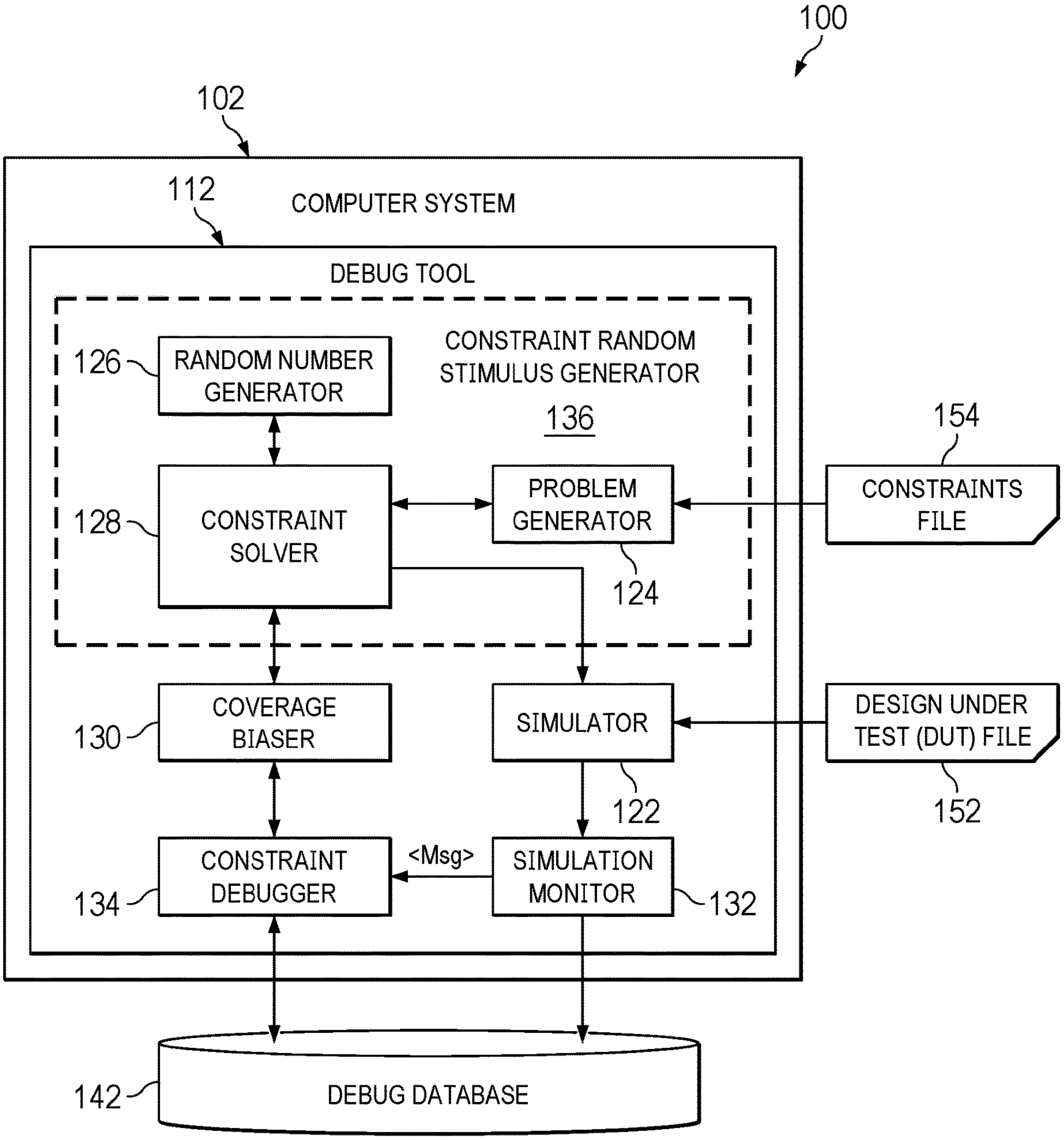
FIG. 1 illustrates a functional verification environment implemented on a computer system according to some examples.

Aspects of the present disclosure relate to bias cause reduction for localizing constraints. Functional verification of a design under test (DUT) may be performed during a design process for a circuit or system to test whether the DUT functions as intended. In this functional verification, stimuli may be used as inputs to the DUT during a simulation of operation of the DUT so that a user may observe the functionality of the DUT that results from the stimuli. Generally, a comprehensive functional verification may include simulating operation of the DUT using a large number of sets of stimuli, where the sets of stimuli are diverse to cover many possible scenarios of use. A random number generator may be used to generate a set of random values for a set of stimuli; however, typically, a set of stimuli to be input into a DUT during simulation has to meet some constraints. A constraint solver may use the random values to solve a constraint problem and generate a set of stimuli that is input into a DUT during simulation. The constraints may include an error or may, while not an error, lead to a rare or unwanted outcome, which may be due to an improper constraint definition by a user. During simulation of the DUT, a constraint may trigger an error message or some other message that may be of interest to a user. Due to a large amount of data contained within a trace captured during the simulation (e.g., stimulus values for simulation cycles, where the number of stimulus values and/or simulation cycles may each be large), identifying a root cause of the error message or other message can be a time consuming task. Currently, identifying a root cause is a manual process. An experienced test engineer reviewing trace data might require multiple days' worth of time to identify a constraint that caused the error message or other message. The manual process may require many iterations of replaying a simulation of the DUT to vary one or more of the stimulus values to identify a root cause. However, the speed with which technology is evolving is driving the desire to reduce the time that these tests, and any resulting debug or redesign, use.

As described in more detail below, a constraint solver may also be biased by a coverage biaser to generate sets of stimulus values that expose more of the available stimuli space for simulation. This biasing may expose more rare circumstances, which may result in even more error messages or other messages being triggered. This biasing may create more trace data than an experienced engineer would be able to manually review to identify a root cause.

According to some examples described herein, a triggering control binary sequence is determined, which has enabled bits that are a proper subset of enabled bits of an original control binary sequence. During an original simulation, constraint problems are solved by a constraint solver of a constraint random stimulus generator to generate stimulus values for simulating the DUT. The constraint solver obtains random values from a random number generator of the constraint random stimulus generator for solving the constraint problems and is biased while solving the constraint problems by a coverage biaser. The original control binary sequence may have enabled bits and disabled bits. The original control binary sequence has enabled (disabled) bits that correspond to biasing (not biasing) of the constraint solver by the coverage biaser of the respective constraint problems that result in a designated message being triggered during the original simulation. The original control binary sequence is thus determined during original simulation of the DUT, and the original simulation of the DUT triggered a designated message, which may be an error message or some other message of interest.

A reduced control binary sequence is constructed that has enabled bits that correspond to a subset of the enabled bits of the original control binary sequence. The reduced control binary sequence may be iteratively reconstructed until the reduced control binary sequence has a reduced (e.g., minimal) number of enabled bits that are sufficient to trigger the designated message resulting from simulating the DUT using the reduced control binary sequence to selectively enable restoring solving steps of the constraint random stimulus generator for each constraint problem corresponding to an enabled bit of the reduced control binary sequence and disable restoring the solving steps for each constraint problem corresponding to a disabled bit of the reduced control binary sequence. Restoring solving steps of a constraint random stimulus generator for a given constraint problem includes, in some examples, enabling the coverage biaser to bias the constraint solver and restoring a state of the random number generator (e.g., RNG state) for the respective constraint problem, which state was the state of the random number generator at an outset of solving the respective constraint problem in the original simulation. Disabling the solving steps may include disabling the coverage biaser, disabling restoring the state of the random number generator, or both. The triggering control binary sequence may then be set equal to the reduced control binary sequence, which is the reduced (e.g., minimal) number of enabled bits that are sufficient to trigger the designated message resulting from simulating the DUT using the triggering control binary sequence to selectively enable and disable restoring solving steps.

With the original control binary sequence, a first trace of a simulation of the DUT is obtained triggering the designated message, and a second trace of a simulation of the DUT is obtained without the designated message. The first trace may be obtained from the original simulation. The second trace may be obtained by disabling restoring solving steps of the respective constraint problems corresponding to enabled bits in the triggering control binary sequence. Any difference of a stimulus value in the first trace and second trace for a corresponding simulation cycle may indicate which constraint(s) triggered the designated message. Any constraint affecting the stimulus value that is different may be a root cause of the triggering of the designated message.

In some examples, states of the random number generator before solving the respective constraint problems are stored during the original simulation in storage, such as a database. The random number generator may have its state restored to the stored state before solving a respective constraint problem for any simulation being re-run. Restoring this state may permit the generation of the stimulus values to be deterministic between the original simulation and the re-run of the simulation, which may result in equal stimulus values when all other conditions (e.g., including whether the coverage biaser is enabled) are equal. In some examples, the state of the random number generator is restored for each constraint problem being solved by the constraint solver during a re-run of the simulation. In such examples, the reduced (or triggering) control binary sequence may be used to selectively enable or disable biasing of the constraint solver by the coverage biaser. In some examples, restoring the state of the random number generator is enabled based on the reduced (or triggering) control binary sequence for the constraint problems to be solved by the constraint solver during a re-run of the simulation. In such examples, the constraint solver may be biased by the coverage biaser for each constraint problem to be solved in the re-run of the simulation.

In some examples, a simulation result (e.g., including any triggered message) from simulating the DUT (e.g., re-running a simulation of the DUT) based on a reduced control binary sequence is stored in storage, such as a database. The simulation result is stored with the reduced control binary sequence or an indication thereof. If the simulation result is used for any subsequent processing, the simulation result may be retrieved from the storage rather than redundantly re-running a simulation of the DUT based on a same reduced control binary sequence. This may avoid duplicative and redundant processing.

In some examples, a binary search method is implemented to identify the enabled bits of the reduced control binary sequence. In other examples, other search methods, such as a linear search method, a brute force method, etc., may be implemented.

Technical advantages of the present disclosure include, but are not limited to, an efficient, automated computer system that reduces enabled bits of a control binary sequence such that stimulus values, and thereby constraints, that trigger a designated message may be localized. By localizing the stimulus values and constraints, identifying a constraint that caused the designated message to be triggered may be facilitated. A number of simulation runs, each based on a computed reduced binary sequence, required to identify and localize the message triggering constraints may be significantly reduced. Reducing the number of simulation runs may reduce the amount of computing resources required to identify the constraint and may free up computing resources for other tasks or jobs. The present computer system may easily scale to analyze large control binary sequences. The functionality of the present computer system may be extended beyond failures to other behaviors to achieve various debugging insights. Further, engineering time required to identify the constraint may be greatly reduced. Implementing techniques described herein may be relatively easy to use because the techniques may be seamlessly implemented and may require no additional inputs or infrastructure. These and other benefits and advantages may be achieved by various examples described herein.

FIG. 1 illustrates a functional verification environment 100 implemented on a computer system 102 according to some examples. The functional verification environment 100 includes a debug tool 112 executable on the computer system 102. The debug tool 112 includes a simulator 122, a problem generator 124, a random number generator 126, a constraint solver 128, a coverage biaser 130, a simulation monitor 132, and a constraint debugger 134. The debug tool 112 is embodied as instructions stored on a non-transitory computer-readable medium, which instructions are executable by one or more processors of the computer system 102. Although one computer system 102 is illustrated in FIG. 1, the debug tool 112 may be distributed across multiple computer systems.

Similarly, each of the simulator 122, problem generator 124, random number generator 126, constraint solver 128, coverage biaser 130, simulation monitor 132, and constraint debugger 134 may be embodied as instructions stored on a non-transitory computer-readable medium, which instructions are executable by one or more processors of the computer system 102. Each of the simulator 122, problem generator 124, random number generator 126, constraint solver 128, coverage biaser 130, simulation monitor 132, and constraint debugger 134 may be a subset of the instructions (e.g., an instruction module) of the debug tool 112. The simulator 122, problem generator 124, random number generator 126, constraint solver 128, coverage biaser 130, simulation monitor 132, and constraint debugger 134 may be stored on, and executed in, a same computer system 102 (like illustrated in FIG. 1) or distributed among or across different computer systems. The instructions embodying the debug tool 112, including the simulator 122, problem generator 124, random number generator 126, constraint solver 128, coverage biaser 130, simulation monitor 132, and constraint debugger 134, when executed by the one or more processors, perform the respective functionality as described herein.

The simulator 122 simulates operation of a design under test (DUT). The DUT is a circuit design that is being designed and tested with the objective to manufacture the circuit represented by the circuit design. The simulator 122 receives a DUT file 152, which includes an electronic (e.g., digital) representation of the DUT. The DUT file 152 may include a hardware description language (HDL) description, such as Verilog, etc., a register transfer level (RTL) description, a gate-level description, a layout-level description, or the like of the DUT. The simulator 122 simulates operation of the DUT of the DUT file 152 using stimulus values of signals that are output from the constraint solver 128.

The problem generator 124 produces a constraint problem to be solved. The problem generator 124 receives a constraints file 154. The constraints file 154 includes declaratory statements of constraints for various signals for which stimulus values are to be generated for simulation. Any constraint may, for example, restrict an upper bound and/or lower bound of a given signal, require a logical relation between multiple signals, etc. The constraints may be or include dynamic constraints based on a state of the DUT during simulation. The problem generator 124 may also observe a state of the DUT during simulation by the simulator 122. The problem generator 124 may dynamically unfold constraints based on a state of the DUT during simulation. The problem generator 124 translates the constraints into a form readable by the constraint solver 128 and dynamically unfolds constraints, if any such constraints are included in the constraints file 154, to generate a constraint problem. The problem generator 124 outputs the constraint problem to the constraint solver 128.

The random number generator 126 produces random values that may be used as seed values by the constraint solver 128. The random values are output from the random number generator 126 to the constraint solver 128. The constraint solver 128 may query the random number generator 126 to generate and output the random values. The random number generator 126 may appear to be non-deterministic and randomized. However, if a state of the random number generator 126 is known at the time of a query, the generated random values may be deterministic based on that state. As described subsequently, a state of the random number generator 126 at the time of a query may be stored, and when a simulation is to be re-run, the state may be restored to the random number generator 126. Hence, the random numbers generated by the random number generator 126 may be deterministically reproduced during re-run of a simulation when the state has been restored. As described subsequently, restoring the state of the random number generator 126 may be selectively enabled or disabled for a given constraint problem during a re-run of simulation.

The constraint solver 128 receives the constraint problem and random values. Based on the received constraint problem and random values, the constraint solver 128 produces stimulus values of signals that are within the constraints of the constraints file 154. The constraint solver 128 may solve a constraint problem based on commands in a user testbench. The constraint solver 128 may solve one or multiple constraint problems during a simulation cycle or may not solve a constraint problem for a simulation cycle. The constraint solver 128 may be or include a constraint satisfiability solver. The generated stimulus values are applied to respective drivers to simulate operation of the DUT by the simulator 122.

Although illustrated and described as separate components, the problem generator 124, random number generator 126, and constraint solver 128 may together be referred to as a constraint random stimulus generator 136. A constraint random stimulus generator 136 may perform the functionality described above, or similar functionality, of the problem generator 124, random number generator 126, and constraint solver 128. A constraint random stimulus generator may be implemented differently in other examples.

The coverage biaser 130 operates with the constraint solver 128 to bias the process (e.g., a constraint satisfiability solver process) implemented by the constraint solver 128 to coerce one or more values. The coverage biaser 130 may implement a machine learning process to identify coverage within the mathematical space available to the stimulus values and to bias the process implemented by the constraint solver 128 to coerce the values to diversify generated stimulus values. The coverage biaser 130 biasing the constraint solver 128 may result in the constraint solver 128 exposing more of the mathematical space available to the stimulus values, which may result in increased chances to expose errors, rare behaviors, or other conditions of interest during simulation. In some examples, the coverage biaser 130 implementing a machine learning process may be trained based on multiple simulations (e.g., different simulations) such that the coverage biaser 130 may bias the process implemented by the constraint solver 128 when the coverage biaser 130 determines that, e.g., the constraint solver 128 may be converging on a possible repeated set of stimulus values. During original simulation, biasing by the coverage biaser 130 may be enabled for each constraint problem, and during re-run of simulation, the biasing by the coverage biaser 130 may be selectively enabled or disabled.

The simulation monitor 132 observes the state of the random number generator 126, the generated stimulus values output by the constraint solver 128 (e.g., as input to the simulator 122), and the state of the DUT during simulation by the simulator 122. The simulation monitor 132 creates and writes a record of operations of the debug tool 112 to a debug database 142. The record may include a trace of the simulation, states of the random number generator 126 for respective constraint problems, and a control binary sequence that is determined for the constraint problems. The trace may include the stimulus values for respective simulation cycles and any message generated by the simulation monitor 132 based on observing the simulation. The simulation monitor 132 is configured to observe the state of the DUT during simulation and to create a message when the state of the DUT and/or simulation is in some condition of interest. Such messages may be created when a fatal error message (e.g., a UVM_FATAL message), a non-fatal error message (e.g., a UVM_ERROR message or a SystemVerilog Assertion (SVA) failure message), or any rare condition (e.g., line, branch, cover bins, design states, etc.) or condition of interest to a user has occurred. In some examples, the message may be any regular expression defined and designated by a user, such as part of a testbench.

According to some examples, during an original simulation of the DUT, an original control binary sequence is created and stored. An original control binary sequence includes bits that correspond to respective constraint problems. The original control binary sequence includes enabled bits that correspond to respective constraint problems biased by the coverage biaser 130 and from which a designated message was triggered during original simulation. An original control binary sequence is created during original simulation by determining an enabled bit or a disabled bit for each constraint problem solved by the constraint solver 128 during the original simulation and biased by the coverage biaser 130. Whether a given bit of an original control binary sequence is an enabled bit or a disabled bit is determined by whether the coverage biaser 130 biased the constraint solver 128 during solving the corresponding problem. In some examples, a logical "0" in the control binary sequence may indicate a disabled bit for a respective constraint problem that was solved without bias by the coverage biaser 130, and a logical "1" may indicate an enabled bit for a respective constraint problem that was solved with bias by the coverage biaser 130. The simulation monitor 132 and/or constraint debugger 134 may create the original control binary sequence during original simulation and may store the original control binary sequence in storage, such as the debug database 142.

The constraint debugger 134 generally determines a triggering control binary sequence. The triggering control binary sequence has enabled bits that are a subset (e.g., a proper subset) of the enabled bits of the original control binary sequence. The triggering control binary sequence has enabled bits that are a reduced (e.g., minimal) number of enabled bits relative to the original control binary sequence and that are sufficient to trigger a designated message when simulation of the DUT is re-run using the triggering control binary sequence.

Generally, in some examples, the constraint debugger 134 accesses the original control binary sequence determined and stored during the original simulation and iteratively constructs a reduced control binary sequence until the reduced control binary sequence has a reduced (e.g., minimal) number of enabled bits that are sufficient to trigger the designated message resulting from simulating the DUT using the reduced control binary sequence. Then, the triggering control binary sequence may be set equal to the reduced control binary sequence.

In re-run of simulation, a reduced or triggering control binary sequence may be used to selectively enable or disable restoring solving steps of the constraint random stimulus generator 136 for the respective constraint problem that were performed during the original simulation of the DUT. Selectively enabling/disabling restoring solving steps may affect biasing for solving the respective constraint problems. Selectively enabling/disabling restoring solving steps may include selectively enabling/disabling biasing by the coverage biaser 130 the constraint solver 128, restoring a state of the random number generator 126, or both. In some examples, biasing by the coverage biaser 130 is selectively enabled or disabled for a given constraint problem based on whether the corresponding bit of the reduced or triggering control binary sequence is an enabled bit or a disabled bit. In some examples, biasing may be affected by the state of the random number generator 126 when queried for seed values for the constraint problem, and in such examples, whether a state of the random number generator 126 is restored for the given constraint problem is based on whether the corresponding bit of the reduced or triggering control binary sequence is an enabled bit or disabled bit. Other methodologies of determining the triggering control binary sequence may be implemented.

Constraint problems that have corresponding enabled bits in the triggering control binary sequence indicate a reduced portion of a trace that localizes the cause that triggered the designated message during simulation. For example, the constraint debugger 134 may, to obtain a first trace, access the trace from the original simulation and/or cause a re-run of simulation of the DUT by the simulator 122 using the original control binary sequence. Further, the constraint debugger 134 may, to obtain a second trace, cause a re-run of simulation of the DUT by the simulator 122 using a non-triggering control binary sequence. The non-triggering control binary sequence has disabled bits corresponding to enabled bits of the triggering control binary sequence. Using the non-triggering control binary sequence, the constraint solver 128 generates stimulus values without biasing by the coverage biaser 130 and/or without restoring states of the random number generator 126 for constraint problems corresponding to the disabled bits of the non-triggering control binary sequence. The constraint debugger 134 may compare the first trace and second trace and identify which stimulus values in corresponding simulation cycles differ. The stimulus values that differ indicate which constraint(s) may have caused the designated message. Any constraint that affected the identified stimulus values may be the cause and may be identified by the constraint debugger 134. With the identified stimulus values, and thereby constraints, a user may more easily identify a problem with a randomization constraint that resulted in the designated message being triggered.

To re-run the simulation, the constraint debugger 134 accesses the record in the debug database 142. The constraint debugger 134 reads, from the debug database 142, a control binary sequence (e.g., the reduced control binary sequence and/or triggering control binary sequence) that was constructed. Depending on implementation in some examples, the constraint debugger 134 may then cause the coverage biaser 130 to be selectively enabled or disabled for constraint problems and/or enable or disable restoring states of the random number generator 126 for constraint problems.

In examples in which biasing by the coverage biaser 130 is enabled or disabled, when a constraint problem is to be solved by the constraint solver 128, the constraint debugger 134 reads a stored state of the random number generator 126 and causes the random number generator 126 to be restored to the read state. The stored state of the random number generator 126 was stored at the beginning of the respective constraint problem during the original simulation. With the state of the random number generator 126 restored and the coverage biaser 130 implementing the given control binary sequence for enabling/disabling biasing of the constraint solver 128, the constraint solver 128 outputs generated stimulus values (that are generated in operation with the random number generator 126, the problem generator 124, and the coverage biaser 130) to the simulator 122, and the simulator 122 simulates operation of the DUT using the generated stimulus values.

In examples in which restoring states of the random number generator 126 is enabled or disabled, when a constraint problem is to be solved by the constraint solver 128, the constraint debugger 134 determines whether to restore the state of the random number generator for a given constraint problem based on the given control binary sequence. When a corresponding bit of the control binary sequence is an enabled bit, the constraint debugger 134 reads a stored state of the random number generator 126 and causes the random number generator 126 to be restored to the read state. When a corresponding bit of the control binary sequence is a disabled bit, the constraint debugger 134 does not restore the state of the random number generator 126. Based on the random values output by the random number generator 126 (e.g., with or without the state being restored), the constraint solver 128 outputs generated stimulus values (that are generated in operation with the random number generator 126, the problem generator 124, and the coverage biaser 130 biasing the constraint solver 128) to the simulator 122, and the simulator 122 simulates operation of the DUT using the generated stimulus values.

The simulation monitor 132 communicates any message <Msg> to the constraint debugger 134. The constraint debugger 134 may write any reduced control binary sequence that triggers the designated message to the debug database 142. The simulation monitor 132 and/or the constraint debugger 134 may write a simulation result, including any message that was triggered by the re-run of the simulation, to the debug database 142. The simulation result may be written in a manner that corresponds with the given control binary sequence used for the re-run of the simulation. Subsequently, the constraint debugger 134 may read a simulation result written to the debug database 142 based on a given control binary sequence such that re-running a simulation based on the given control binary sequence may be avoided.

Although a control binary sequence including enable bits and disable bits is described herein, a control binary sequence may be any abstraction to track which constraint problems result in the triggering of a designated message. For example, a control binary sequence may be, instead of being actual bits corresponding to a respective constraint problem, a set of indexes or numbers that correspond to or identify respective constraint problems that result in the triggering of the designated message. A control binary sequence may take many forms.

FIG. 2 illustrates pseudocode of a use model for implementing the constraint debugger 134 according to some examples. At line 201, the environment, including source files, is compiled, which generates an executable binary file. At line 202, the binary file is executed to simulate the DUT. The coverage biaser 130 is enabled to operate in the simulation by the "<enable_cb>" in line 202. The coverage biaser 130 creates an original control binary sequence during the simulation. After compiling and simulating, the constraint debugger 134 is executed by execution of lines 203 through 207. Execution of the constraint debugger 134 includes a loop at lines 203 through 207 that re-runs the simulation at line 204. In the re-run of the simulation, the coverage biaser 130 is enabled by "<enable_cb_rerun>." The loop includes user runtime switches for the constraint debugging. A user runtime switch at line 205 indicates the record to be debugged, which in the illustration of FIG. 2 is "+ntb_solver_bias_debug_record=<DBG>". Another user runtime switch at line 206 indicates the type of designated message identified for debugging, which in the illustration of FIG. 2 is "+ntb_solver_bias_debug_regex=<DesMsg>". At line 207, a condition for terminating the loop is indicated, which in this example is that a status flag of the record is equal to "DONE" (e.g., <DBG>/dbg.status=DONE) or a resource threshold has been met.

Figure 3:
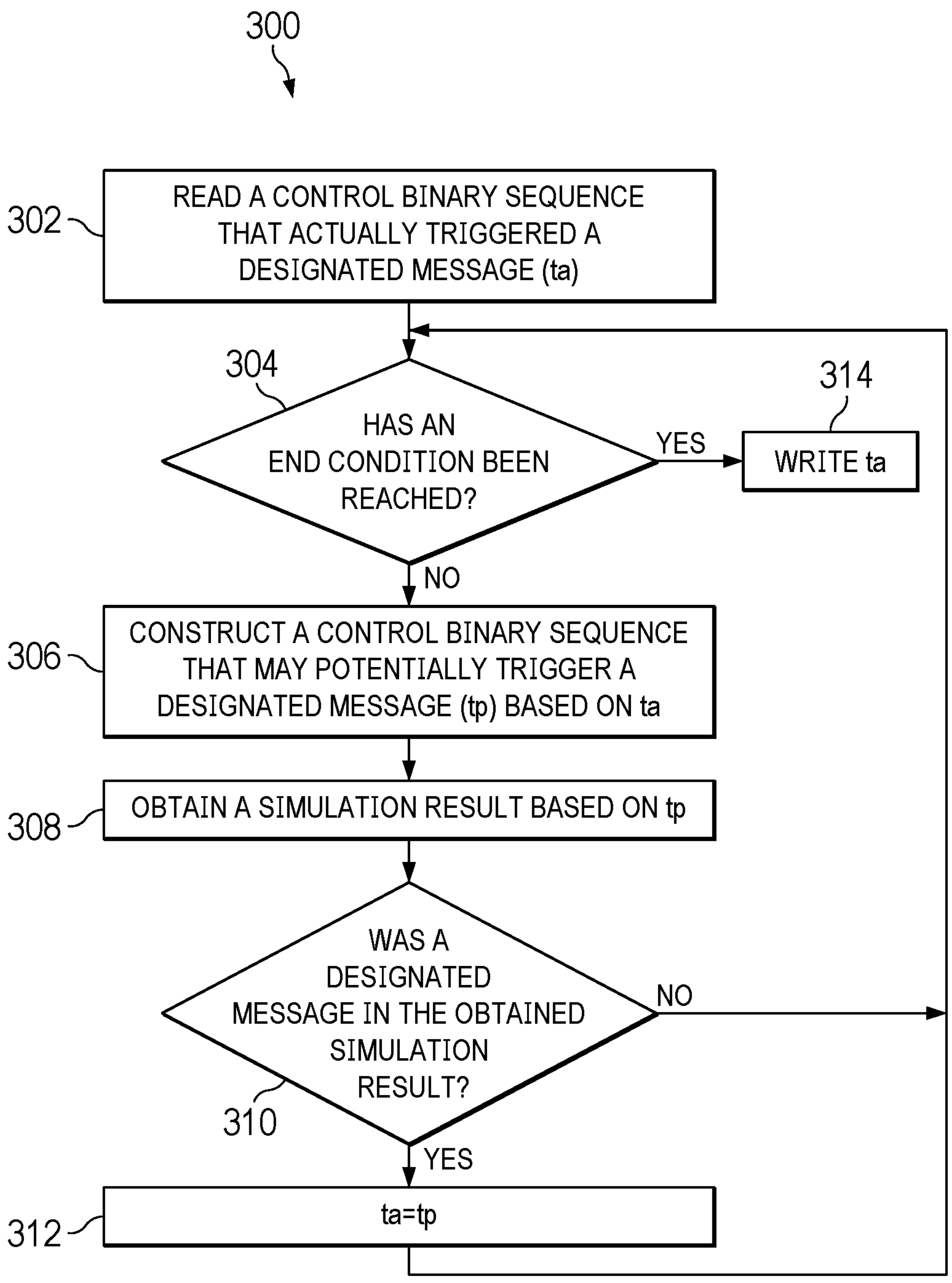
FIG. 3 is a method for determining a triggering control binary sequence according to some examples.

FIG. 3 illustrates a method 300 for determining a triggering control binary sequence according to some examples. The constraint debugger 134 implements operations of the method 300 and/or causes operations of the method 300 to be implemented in some examples.

At 302, a control binary sequence that actually triggered a designated message (ta) is read, such as from a database. For ease hereinafter, the control binary sequence that actually triggered a designated message (ta) is referred to as "actual control binary sequence (ta)." At 302, the actual control binary sequence (ta) may be the original control binary sequence that was generated during original simulation, as described above.

At 304, a determination whether an end condition has been reached is made. The end condition may be or include any of a number of conditions and any logical combination of a number of conditions. For example, the end condition may include whether a status flag of the record indicates that the method 300 is complete (e.g., set to "DONE," like in FIG. 2). The end condition may be whether the method 300 has run for a prescribed time or has used a prescribed amount of resources. The end condition may also be or include a logical OR and/or a logical AND of different conditions. Different methods for determining a triggering control binary sequence according to other examples may implement different conditions.

At 306, a control binary sequence that may potentially trigger a designated message (tp) is constructed based on the actual control binary sequence (ta). For ease hereinafter, the control binary sequence that may potentially trigger a designated message (tp) is referred to as "potential control binary sequence (tp)." The enabled bits in the potential control binary sequence (tp), in this example, are a subset (e.g., proper subset) of the enabled bits in the actual control binary sequence (ta). All other bits in the potential control binary sequence (tp) are disabled bits. The potential control binary sequence (tp) is a reduced control binary sequence. The method 300 may implement any of a number of methods at 306 to determine which bits of the potential control binary sequence (tp) to enable and which bits of the potential control binary sequence (tp) to disable in constructing the potential control binary sequence (tp). Such methods include a binary search method, a linear search method, and a brute force (e.g., all possible combinations) method. An example binary search method is described in detail subsequently.

At 308, a simulation result based on the potential control binary sequence (tp) is obtained. In some examples, a simulation based on the potential control binary sequence (tp) may have previously occurred in a prior iteration. In such circumstances, the simulation result may be stored (e.g., cached), such as in a database (e.g., the debug database 142). If the simulation result is stored, the simulation result is read at 308. This may obviate duplication of a previous simulation, which may reduce processing time and reduce resource usage. If the simulation result was not stored (e.g., such as when the method 300 does not store such results or if a simulation based on the potential control binary sequence (tp) has not previously occurred), the simulation result may be obtained by performing a re-run of the simulation of the DUT using the potential control binary sequence (tp) to selectively, for each constraint problem, restore solving steps of the constraint random stimulus generator 136 for the respective constraint problem that were performed during the original simulation of the DUT. Selectively restoring the solving steps may including enabling/disabling the coverage biaser 130 and/or enabling/disabling restoring states of the random number generator 126. As noted previously, when the potential control binary sequence (tp) enables/disables the coverage biaser 130, the states of the random number generator 126 from the original simulation is read, such as from the debug database 142, and the random number generator 126 is restored to the read state for subsequent simulation during 308. When the potential control binary sequence (tp) enables/disables restoring states of the random number generator 126, the coverage biaser 130 is enabled during the simulation. The simulation monitor 132 may create a record, as described previously, and may monitor what, if any, message is triggered during the simulation. Any message observed by the simulation monitor 132 is communicated from the simulation monitor 132 to the constraint debugger 134.

At 310, a determination is made whether a designated message was in the obtained simulation result. The designated message may be designated, for example, in a user testbench, hardcoded in the constraint debugger 134, or by another mechanism. If the determination is that the designated message is not included in the obtained simulation result, the method 300 loops back to 304. If the determination is that the designated message is included in the obtained simulation result, at 312, the actual control binary sequence (ta) is set equal to the potential control binary sequence (tp). After setting the actual control binary sequence (ta) equal to the potential control binary sequence (tp), the actual control binary sequence (ta) may be written, such as to the debug database 142. The method 300 then loops back to 304.

If the determination that an end condition has been reached at 304, at 314, the actual control binary sequence (ta) is written (e.g., if not written previously). At 314, the actual control binary sequence (ta) is the triggering control binary sequence. Of note, the determination at 304 is shown located in the flow of the loop as an example. Such a determination may be located elsewhere in the logical flow of the loop, such as depending upon the end condition.

On subsequent iterations, at 306, the potential control binary sequence (tp) is attempted to be constructed to be a subset of enabled bits of the actual control binary sequence (ta) that is a different subset of enabled bits of the potential control binary sequence (tp) of the immediately preceding iteration. As noted above, a later iteration may construct a potential control binary sequence (tp) that is the same as a potential control binary sequence (tp) constructed in some previous iteration. In some examples, if a potential control binary sequence (tp) is not able to be constructed at 306, a status flag may be set to indicate that the method 300 should be completed, which may cause the method 300 to be completed as an end condition in 304.

In some examples, conditions and results of each re-run of the simulation that occurs at 308 (e.g., for the iterations of the method 300) may be made available to a user on a video display unit (e.g., via a graphical user interface (GUI)) by the constraint debugger 134. A selectable line item for each re-run of the simulation may be displayed by a GUI generated by the constraint debugger 134. Selecting a line item by a user (e.g., by a cursor control device, such as a mouse) may display, by the GUI, trace information of the respective re-run of the simulation, the potential control binary sequence (tp) used in the respective re-run, and/or the states of the random number generator 126. Hence, in such examples, a re-run of a simulation at 308 includes storing, such as in the debug database 142, a trace, the potential control binary sequence (tp), and states of the random number generator 126. The user may be permitted to modify any stimulus value of the trace, the potential control binary sequence (tp), and/or a state of the random number generator 126 and re-run the simulation of the DUT using the modified data.

FIGS. 4A, 4B, 4C, 5A, 5B, and 5C illustrate a method 400A, 400B, 400C (collectively, method 400) and pseudocode for determining a triggering control binary sequence according to some examples. FIGS. 5A through 5C show example pseudocode to implement the method 400 of FIGS. 4A through 4C. The method 400 of FIGS. 4A through 4C and the pseudocode of FIGS. 5A through 5C implement a binary search method (e.g., referred to as a binary search reduction (bsr) method) according to some examples. The method 400 of FIGS. 4A through 4C and the pseudocode of FIGS. 5A through 5C may be implemented by the constraint debugger 134.

The method 400 may rely on a monotone property to identify a reduced (e.g., minimal) subset of enabled bits for a triggering control binary sequence. For a monotone property, it is assumed that if a proper subset of enabled bits of a control binary sequence Y causes the designated message to be triggered, then a superset of enabled bits of a control binary sequence X also causes the designated message to be triggered, where $Y \subset X$. Conversely, if the superset of enabled bits of the control binary sequence X does not cause the designated message to be triggered, then the proper subset of enabled bits of the control binary sequence Y also does not cause the designated message to be triggered. The monotone property may result in an observation that adding enabled bits in a control binary sequence does not prevent triggering of a designated message and that some enabled bits in a control binary sequence may not be necessary to trigger a designated message. Hence, enabled bits that are not required to trigger a designated message may be disabled such that the designated message is triggered by remaining enabled bits. If a scenario occurs in which this monotone property does not hold true, a reduced control binary sequence may still be determined; however, that reduced control binary sequence may not have a minimal set of enabled bits.

Generally, the method 400 identifies indexes of enabled bits of an original control binary sequence that are sufficient to trigger a designated message from simulation of a DUT using the enabled bits identified by the indexes. The method 400 conceptually searches within iterative ranges. Within a searched range, a respective lowest upper index and a respective highest lower index are determined. The lowest upper index(es) and the highest lower index(es) indicate the enabled bits of the original control binary sequence within the searched range that are sufficient to trigger the designated message from simulation of the DUT. Iteratively, a successive range within the previous iteration lowest upper index and highest lower index is searched until no other range is available to be searched. Of note, a lowest upper index of a range may be equal to a highest lower index of the range. The lowest upper index(es) and highest lower index (es) are collected in a set.

As illustrated, the method 400 initiates a range spanning the indexes of an original control binary sequence (e.g., indicated by a lower index (j) initiated to zero and an upper index (k) initiated to N−1) and initiates an index set (psi) as empty. The method 400 searches for a lowest upper index within the range and searches for a highest lower index in the range. The lowest upper index and the highest lower index that are identified satisfy three conditions:

(1) the designated message is triggered by a simulation of the DUT using a reduced control binary sequence, where the reduced control binary sequence has enabled bits corresponding to enabled bits of the original control binary sequence at a respective index in the index set or at a respective index from the highest lower index to the lowest upper index;

(2) the designated message is not triggered by a simulation of the DUT using a reduced control binary sequence, where the reduced control binary sequence has enabled bits corresponding to enabled bits of the original control binary sequence at a respective index in the index set or at a respective index from the highest lower index plus one to the lowest upper index; and (3) the designated message is not triggered by a simulation of the DUT using a reduced control binary sequence, where the reduced control binary sequence has enabled bits corresponding to enabled bits of the original control binary sequence at a respective index in the index set or at a respective index from the highest lower index to the lowest upper index minus one.

The method 400 then collects the highest lower index and the lowest upper index in the index set and sets the range to be from the highest lower index plus one to the lowest upper index minus one. The method 400 then iterates back to searching for a lowest upper index within the range and searches for a highest lower index in the range.

The iteration of the method 400 continues until the designated message is triggered by a simulation of the DUT using a reduced control binary sequence, where the reduced control binary sequence has enabled bits corresponding to enabled bits of the original control binary sequence at a respective index in the index set. This condition may occur when no other range is available to be searched (e.g., when a highest lower index and a lowest upper index collected in the index set in an iteration are within one) or when a range to be searched in an iteration does not include any enabled bits that trigger the designated message. The method 400 illustrates how this condition may be implemented. When this condition is reached, a status flag in the record may be set to "DONE", which may trigger completion of iterations of the method 400, although not illustrated. When the iteration(s) are complete, the reduced control binary sequence is the triggering control binary sequence. An additional condition for completion may be included, such as when a threshold for run time or resources used is met or exceeded.

Figure 4A:
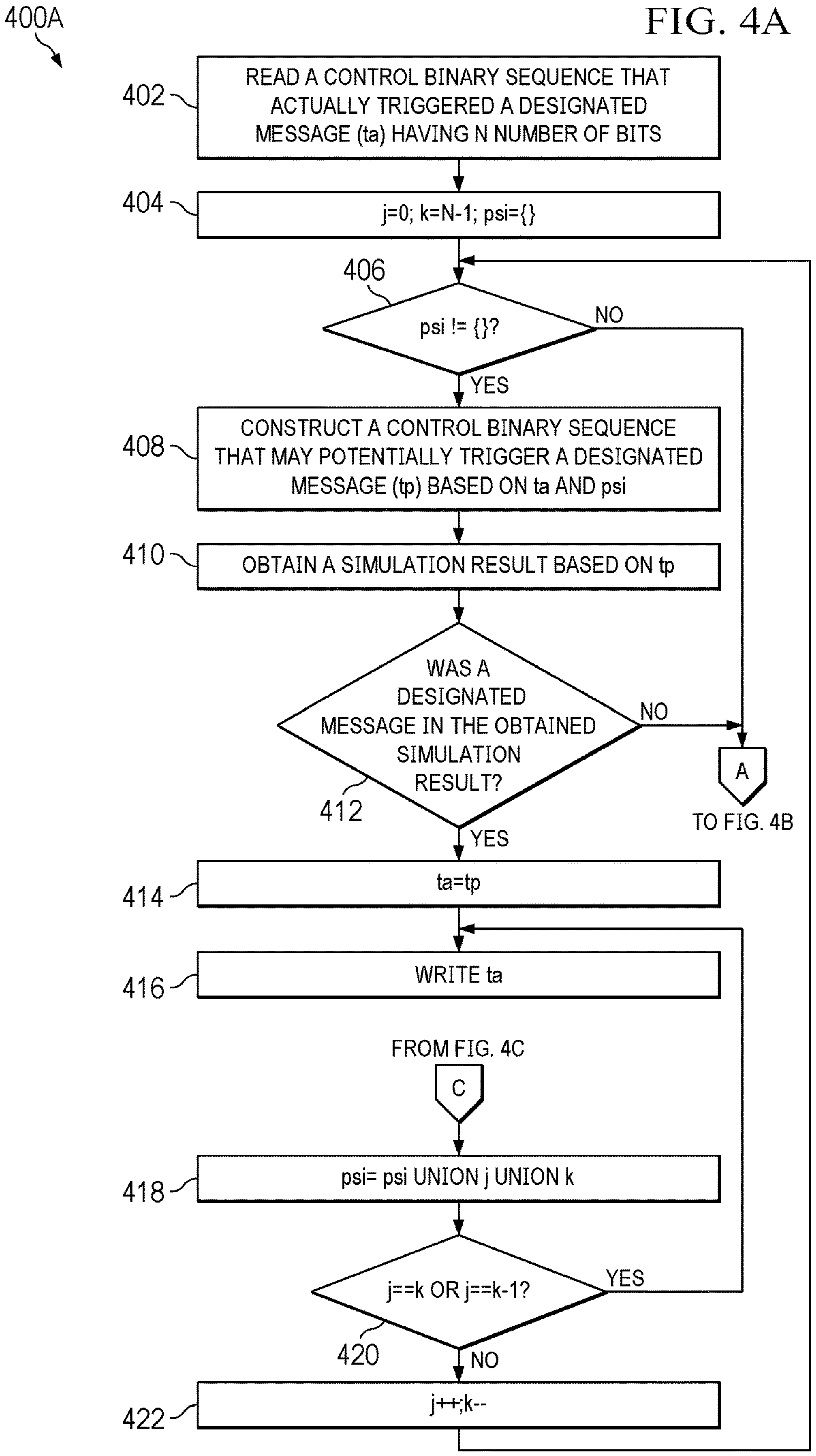
FIGS. 4A, 4B, and 4C are a method for determining a triggering control binary sequence according to some examples.

Referring to FIG. 4A, at 402, an actual control binary sequence (ta) is read. The actual control binary sequence (ta) has N number of bits. The actual control binary sequence (ta) is read at line 502 of FIG. 5A. The actual control binary sequence (ta) at 402 and line 502 is the original control binary sequence.

At 404, lower index variable (j) is set equal to zero; upper index variable (k) is set equal to N−1; and an index variable set (psi) is defined as empty. The variables j, k, and psi are defined and initialized at lines 503, 504, 505, respectively, of FIG. 5A. The variables j and k indicate a range to be searched.

At 406, a determination is made whether psi is not empty. If psi is empty, the method 400 proceeds to 432 in FIG. 4B. If psi is determined to not be empty, at 408, a potential control binary sequence (tp) is constructed based on the actual control binary sequence (ta) and on psi. Any potential control binary sequence (tp) described in the method 400 is a reduced control binary sequence. At 410, a simulation result is obtained based on the potential control binary sequence (tp) that was constructed at 408. At 412, a determination is made whether a designated message was included in the simulation result obtained at 410. If the designated message was included, at 414, the actual control binary sequence (ta) is set equal to the potential control binary sequence (tp), and at 416, the actual control binary sequence (ta) is written. The actual control binary sequence (ta) at 416 is the triggering control binary sequence. The method 400 is completed upon execution of 416.

The conditional statement at 406 is implemented at line 508 in FIG. 5A. Line 509 implements the operation of 408. At line 509, a potential control binary sequence (tp) is constructed based on each index contained in psi and no other index (e.g., without any enabled bit within the range from j to k) by a function call constructTp( ). The function call rerunSim( ) at line 510 implements the operation of 410. The function call rerunSim( ) causes a simulation result of simulation using the potential control binary sequence (tp). to be obtained, which may include re-running the simulation based on the potential control binary sequence (tp). The if conditional statement of line 510 implements the conditional statement at 412. The conditional if statement at line 510 determines whether the function call rerunSim( ) returns the designated message <DesMsg>. Lines 511, 512, and 520 implement the operation of 414, 416.

Generally, referring to FIGS. 4A and 5A, the determination at 406 and corresponding conditional if statement at line 508 determines whether psi includes any index. In an initial iteration of the loop (e.g., the while loop that begins at line 507 and ends at line 519), psi is empty, and the operations at 408, 410, 412, 414 and at lines 509 through 512 are omitted.

In reaching 414 and line 511, the method 400 determines that a range of the original control binary sequence to be searched in an iteration does not include any enabled bits that trigger the designated message. If psi includes any index (e.g., is not empty), a determination is made whether a range of the actual control binary sequence (ta) from j to k includes any index of an enabled bit that causes a designated message to be triggered. The potential control binary sequence (tp) is constructed based on psi without regard to j and k, and a simulation result is obtained based on this potential control binary sequence (tp). Hence, if the designated message is obtained or returned, the potential control binary sequence (tp) has enabled bits at the indexes contained in psi that are sufficient to trigger a designated message, and no bits in an range from j to k are required to trigger the designated message. Hence, the method 400 has identified the enabled bits to be in the triggering control binary sequence (e.g., by the index(es) collected in psi) and is to be completed.

Referring to FIG. 5B, a definition of the function call constructTp( ) is provided in pseudocode as an example. As indicated, the function call constructTp( ) is called at line 509 in FIG. 5A and is called elsewhere. At line 531, the function call constructTp( ) has psi, a lower range index (range_lower), and an upper range index (range_upper) passed as input parameters. The parameters range_lower and range_upper may be null values, as shown at line 509, when no range is the be included in constructing the potential control binary sequence (tp). At line 535, a potential control binary sequence (tp) is initiated to zero for N bits (e.g., having indexes from 0 to N−1). At line 536, bits of the potential control binary sequence (tp) at indexes contained in psi are set equal to bits of the actual control binary sequence (ta) at corresponding indexes contained in psi, for each index contained in psi. At line 537, a conditional if statement determines whether a null value is passed for one or both of range_lower and range_upper. If so (e.g., such as when constructTp( ) is called at line 509 of FIG. 5A), lines 538 and 539 are omitted (e.g., the potential control binary sequence (tp) is not constructed based on a range). If non-null values are passed for range_lower and range_upper, at lines 538 and 539, iteratively, bits of the potential control binary sequence (tp) at indexes within the range from range_lower to range_upper are set equal to bits of the actual control binary sequence (ta) at corresponding indexes the range from range_lower to range_upper. At line 541, the potential control binary sequence (tp) is returned.

Continuing with FIG. 5B, a definition of the function call rerunSim( ) is provided in pseudocode as an example. As indicated, the function call rerunSim( ) is called at line 510 in FIG. 5A and is called elsewhere. At line 544, the function call rerunSim( ) has a potential control binary sequence (tp) passed as an input parameter. At line 545, a conditional if statement checks whether a previous control binary sequence that was the same as the potential control binary sequence (tp) was previously simulated and has a stored (e.g., cached) simulation result. If so, at line 546, the cached simulation result is returned. If not, at line 547, the state of the random number generator 126 is restored to a state that was stored. The restoring of the state of the random number generator 126 includes reading the state from storage, such as the debug database 142, and writing the read state to the random number generator 126. At line 548, the DUT is simulated with the coverage biaser 130 enabled as indicated by the potential control binary sequence (tp). At line 549, a simulation result, which may be a designated message <DesMsg>, is returned.

The definition of the function call rerunSim( ) uses the potential control binary sequence (tp) to selectively enable and disable biasing of the constraint solver 128 by the coverage biaser 130. In such examples, the state of the random number generator 126 is restored, for solving each constraint problem that is to be solved by the constraint solver 128, to the respective state that the random number generator 126 was in when the respective constrain problem was solved during original simulation. In other examples, the definition of the function call rerunSim( ) may enable biasing of the constraint solver 128 by the coverage biaser 130 for each constraint problem to be solved for the simulation. In such examples, the function call rerunSim( ) may use the potential control binary sequence (tp) to selectively enable and disable restoring a state of the random number generator 126 for solving a respective constraint problem.

Figure 4B:
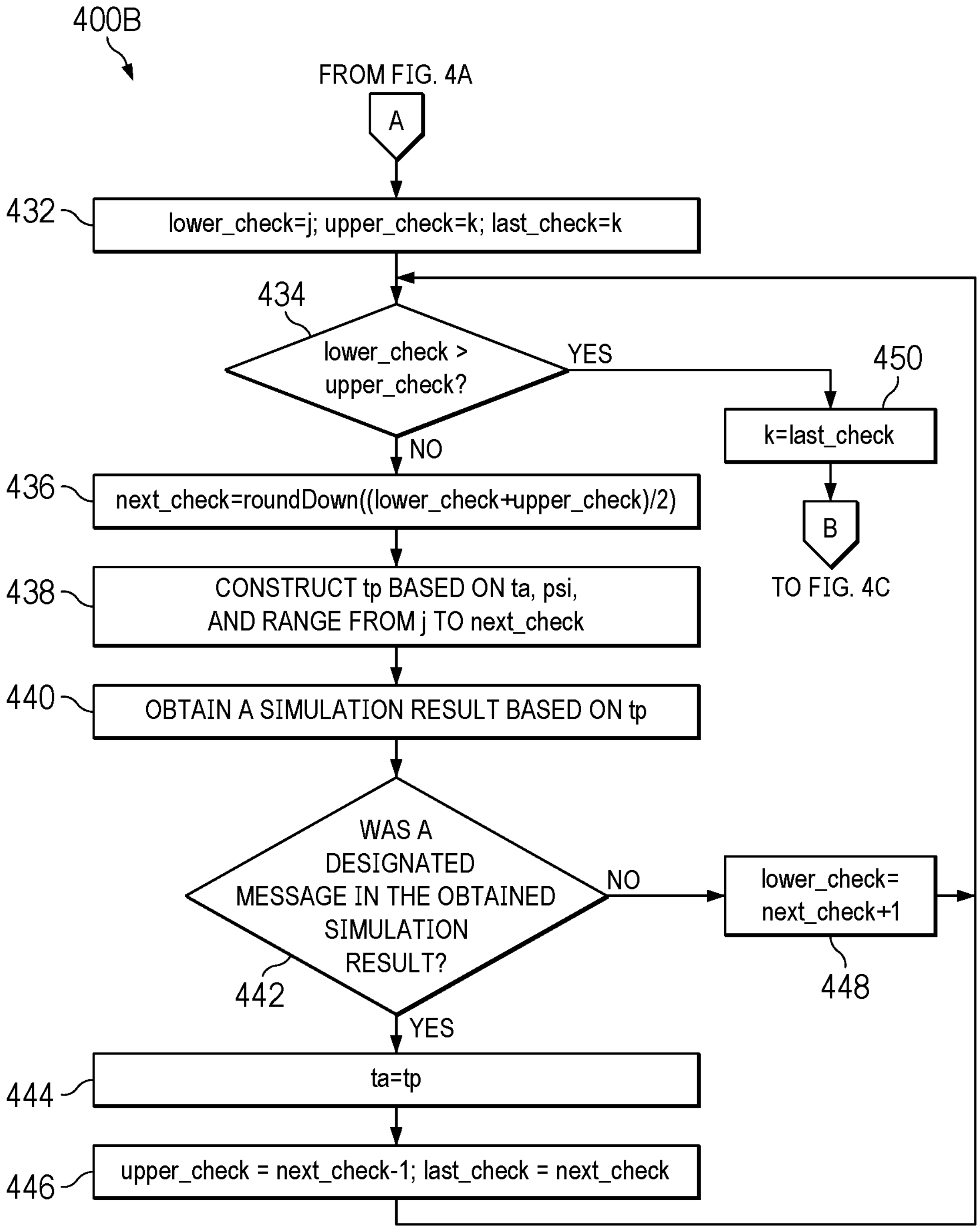
Figure 4C:
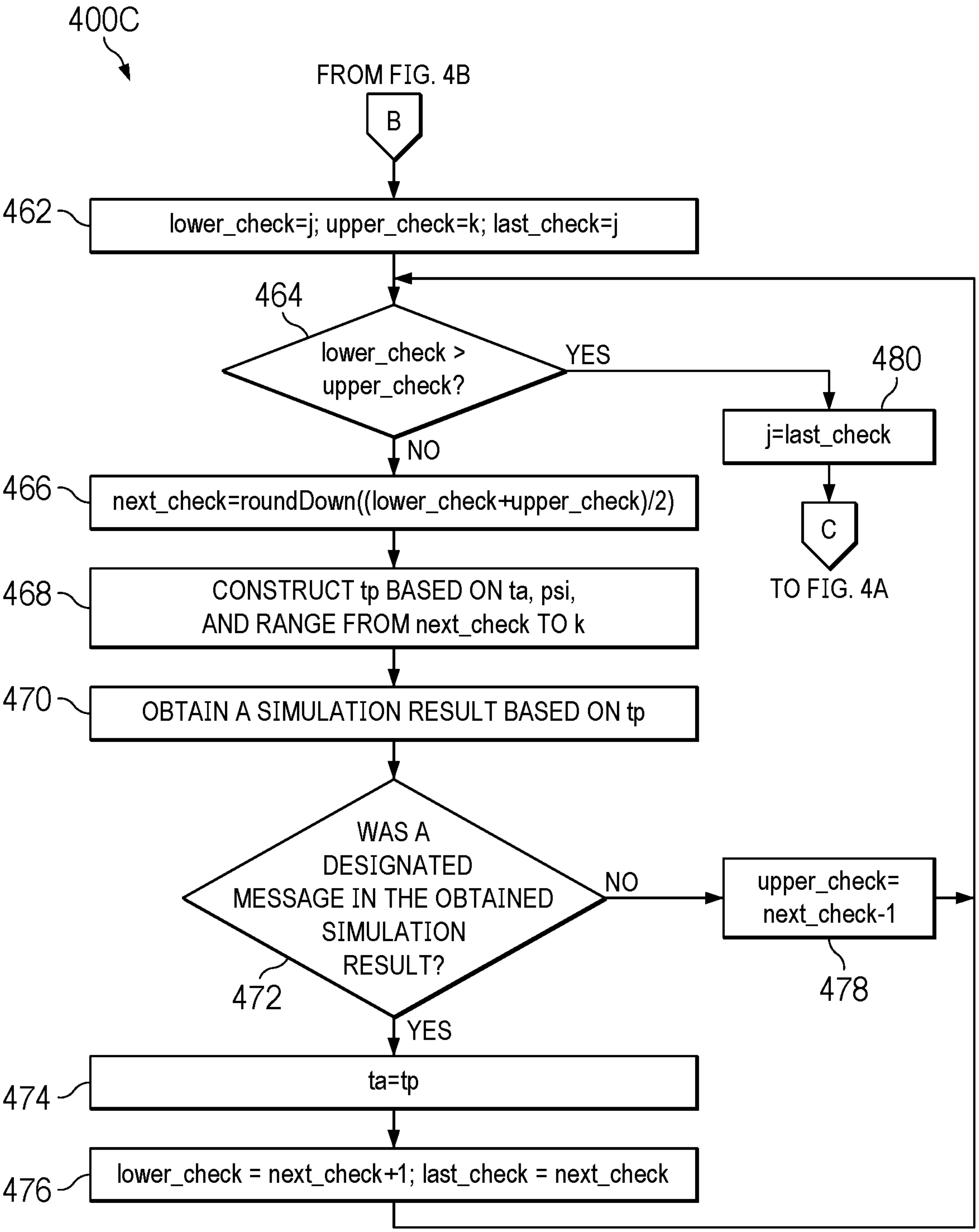

Referring back to FIG. 4A, if (a) psi is empty as determined at 406 (e.g., the NO branch) or (b) psi is not empty as determined at 406 (e.g., the YES branch) and a designated message was not included in the obtained simulation result as determined at 412, the method 400 proceeds to the operations of FIGS. 4B and 4C before returning to 418 in FIG. 4A. Generally, the operations of FIG. 4B determines and sets k, and the operations of FIG. 4C determines and sets j, as will be described subsequently. Generally, FIG. 4B determines, and sets as k, a lowest upper index of a range such that a designated message is triggered upon simulation using a potential control binary sequence (tp) constructed using a set of indexes that are the union of the range and psi. Similarly, FIG. 4C identifies, and sets as j, a highest lower index of a range such that a designated message is triggered upon simulation using a potential control binary sequence (tp) constructed using a set of indexes that are the union of the range and psi. Further, FIGS. 4B and 4C updates the actual control binary sequence (ta) when a potential control binary sequence (tp) is constructed that causes a designated message to be triggered.

At 418, psi collects j and k within psi. Psi is the union of psi, j, and k. This union is at line 515 of FIG. 5A. At 420, a determination is made whether j is equal to k or to k−1. If so, at 416, the actual control binary sequence (ta) is written, as described above. The determination of 420 is at line 516, which, when true, causes a break from the while loop to write the actual control binary sequence (ta) at line 520. Generally, when j is equal to k or k−1, the iteration of the loop has identified the same index or neighboring indexes such that no range exists between j and k for a subsequent iteration of the loop to search. Hence, the loop is exited, and the actual control binary sequence (ta) is written.

When j is equal to neither k nor k−1, at 422, j is incremented by one, and k is decremented by one. Operation then loops back to 406. Incrementing j and decrementing k is at lines 517 and 518 of FIG. 5A, and operation loops back to the beginning of the while loop defined beginning at line 507. Generally, with operation reaching 422 and lines 517 and 518, bits of the actual control binary sequence (ta) at indexes in the range identified by j and k and in psi are sufficient to trigger the designated message; however, a range j+1 to k−1 has not been searched to remove any index of a bit that may not be necessary to trigger the designated message. A subsequent iteration of the loop (beginning at 406 and line 507) searches the range j+1 to k−1. This iterative approach continues until the range j+1 to k−1 (or j to k in relation to the subsequent iteration) does not include a bit that is needed to trigger the designated message as determined by 412 and line 510 or until no range remains to be analyzed as determined by 420 and line 516.

Turning to FIG. 4B, k is determined and set. At 432, which follows 406 or 412 in FIG. 4A, a lower range check index variable (lower_check) is set equal to j; an upper range check index variable (upper_check) is set equal to k; and a last check index variable (last_check) is set equal to k. This operation sets outer bounds of a range (e.g., from j to k) that is to be searched for k. At 434, a determination is made whether lower_check is greater than upper_check. If not, at 436, a next check index variable (next_check) is set to a rounded down integer of a midpoint between lower_check and upper_check (e.g., roundDown((lower_check+upper_check)/2)).

At 438, a potential control binary sequence (tp) is constructed based on the actual control binary sequence (ta), on psi, and on a range from j to next_check. At 440, a simulation result is obtained based on the potential control binary sequence (tp) that was constructed at 438. At 442, a determination is made whether a designated message was included in the simulation result obtained at 440. If a designated message was included, at 444, the actual control binary sequence (ta) is set equal to the potential control binary sequence (tp). Then, at 446, upper_check is set equal to next_check−1, and last_check is set equal to next_check. If a designated message was not included as determined at 442, at 448, lower_check is set equal to next_check+1. Following 446 and 448, operation loops back to 434. If the determination is made at 434 that lower_check is greater than upper_check, at 450 k is set equal to last_check, and operation proceeds to 462 in FIG. 4C.

The operations of FIG. 4B are implemented by line 513 in FIG. 5A and the definition of the function call bsrUpper( ) in FIG. 5C. At line 513 of FIG. 5A, k is set equal to the returned value of the function call bsrUpper( ) in which j and k are passed as various parameters.

Referring to FIG. 5C, a definition of the function call bsrUpper( ) is provided in pseudocode as an example. At line 561, the function call bsrUpper( ) has lower_check, upper_check, and last_check passed as input parameters. Calling the function bsrUpper( ) at line 513 of FIG. 5A sets lower_check equal to j, upper_check equal to k, and last_check equal to k as indicated at 432 of FIG. 4B. Back to FIG. 5C, line 562 includes a conditional if state determining whether lower_check is greater than upper_check, which implements 434 of FIG. 4B. At line 563, last_check is returned, which with line 513 setting k equal to the returned value of the function call bsrUpper( ) implements 450 of FIG. 4B.

At line 564, next_check is set to implement 436 of FIG. 4B. At line 565, a potential control binary sequence (tp) is constructed by the function call constructTp( ) with input parameters psi, j as range_lower, and next_check as range_upper, which implements 438 of FIG. 4B. The functionality of the function call constructTp( ) was described above with respect to FIG. 5B. In the function call constructTp( ) at line 565, the range for which the potential control binary sequence (tp) is constructed based on the actual control binary sequence (ta) at lines 538 and 539 of FIG. 5B is from j to next_check.

Then, at line 566, the function call rerunSim( ) causes a simulation result based on the potential control binary sequence (tp) to be returned, which implements 440 of FIG. 4B. The functionality of the function call rerunSim( ) was described above with respect to FIG. 5B. The conditional if statement at line 566 determines whether the function call rerunSim( ) returns the designated message <DesMsg>, which implements 442 of FIG. 4B. If the designated message is returned, the potential control binary sequence (tp) includes enabled bits at the indexes contained in psi and at indexes within the range j to next_check that are sufficient to trigger the designated message. Hence, if the designated message is returned, at line 567, the actual control binary sequence (ta) is set equal to the potential control binary sequence (tp), which implements 444 of FIG. 4B. Further, if the designated message is returned, the function call bsrUpper( ) is recursively called at line 568, with next_check−1 passed as upper_check and next_check as last_check. Line 568 implements the functionality of 446 and the loop from 446 to 434 of FIG. 4B. If the if the designated message is not returned, the function call bsrUpper( ) is recursively called at line 570, with next_check+1 passed as lower_check. Line 570 implements the functionality of 448 and the loop from 448 to 434 of FIG. 4B.

Generally, the binary search method illustrated by FIGS. 4B and 5C analyzes a range in which a lowest upper index may reside and searches the range using a binary search until the lowest upper index is identified. The range is the range from lower_check to upper_check, which initially is from j to k. The binary search divides the range into a lower half and an upper half by determining next_check (e.g., which is generally halfway between lower_check and upper_check), and determines whether the lowest upper index is present in a given half. In FIGS. 4B and 5C, the lower half is analyzed for the lower upper index by constructing a potential control binary sequence (tp) based on the range from j to next_check and re-running simulation based on the potential control binary sequence (tp). Based on the monotone property, if the designated message is triggered in the re-run of the simulation, the lowest upper index is present in the lower half, and the lower half is to be further searched for the lowest upper index. The upper half may be discarded as not being necessary to trigger the designated message. Conversely, if the designated message is not triggered in the re-run of the simulation, the lowest upper index is not present in the lower half, and the upper half is to be searched for the lowest upper index. The various halves are recursively searched until the range from lower_check to upper_check includes no more than one index. The result of such searching is that:

(1) a potential control binary sequence (tp) constructed based on psi and a range from j to k+1 (where k is set in 450) that is used in a simulation triggers the designated message;

(2) a potential control binary sequence (tp) constructed based on psi and a range from j to k (where k is set in 450) that is used in a simulation triggers the designated message; and (3) a potential control binary sequence (tp) constructed based on psi and a range from j to k−1 (where k is set in 450) that is used in a simulation does not trigger the designated message.

Turning to FIG. 4C, j is determined and set. At 462, which follows 450 in FIG. 4B, lower_check is set equal to j; upper_check is set equal to k; and last_check is set equal to j. This operation sets outer bounds of a range (e.g., from j to k) that is to be searched for j. At 464, a determination is made whether lower_check is greater than upper_check. If not, at 466, next_check is set to a rounded down integer of a midpoint between lower_check and upper_check (e.g., roundDown ((lower_check+upper_check)/2)).

At 468, a potential control binary sequence (tp) is constructed based on the actual control binary sequence (ta), on psi, and on a range from next_check to k. At 470, a simulation result are obtained based on the potential control binary sequence (tp) that was constructed at 468. At 472, a determination is made whether a designated message was included in the simulation result obtained at 470. If the designated message was included, at 474, the actual control binary sequence (ta) is set equal to the potential control binary sequence (tp). Then, at 476, lower_check is set equal to next_check+1, and last_check is set equal to next_check. If the designated message was not included as determined at 472, at 478, upper_check is set equal to next_check−1. Following 476 and 478, operation loops back to 464. If the determination is made at 464 that lower_check is greater than upper_check, at 470 j is set equal to last_check, and operation proceeds to 418 in FIG. 4A.

The operations of FIG. 4C are implemented by line 514 in FIG. 5A and the definition of the function call bsrLower( ) in FIG. 5C. At line 514 of FIG. 5A, j is set equal to the returned value of the function call bsrLower( ), in which j and k are passed as various parameters.

Referring to FIG. 5C, a definition of the function call bsrLower( ) is provided in pseudocode as an example. At line 573, the function call bsrLower( ) has lower_check, upper_check, and last_check passed as input parameters. Calling the function bsrLower( ) at line 514 of FIG. 5A sets lower_check equal to j, upper_check equal to k, and last_check equal to j as indicated at 462 of FIG. 4C. Back to FIG. 5C, line 574 includes a conditional if state determining whether lower_check is greater than upper_check, which implements 464 of FIG. 4C. At line 575, last_check is returned, which with line 514 setting j equal to the returned value of the function call bsrLower( ) implements 480 of FIG. 4C.

At line 576, next_check is set to implement 466 of FIG. 4C. At line 577, a potential control binary sequence (tp) is constructed by the function call constructTp( ) with input parameters psi, next_check as range_lower, and k as range_upper, which implements 468 of FIG. 4C. The functionality of the function call constructTp( ) was described above with respect to FIG. 5B. In the function call constructTp( ) at line 577, the range for which the potential control binary sequence (tp) is constructed based on the actual control binary sequence (ta) at lines 538 and 539 of FIG. 5B is from next_check to k.

Then, at line 578, the function call rerunSim( ) causes a simulation result based on the potential control binary sequence (tp) to be returned, which implements 470 of FIG. 4C. The functionality of the function call rerunSim( ) was described above with respect to FIG. 5B. The conditional if statement at line 578 determines whether the function call rerunSim( ) returns the designated message <DesMsg>, which implements 472 of FIG. 4C. If the designated message is returned, the potential control binary sequence (tp) includes enabled bits at the indexes contained in psi and at indexes within the range next_check to k that are sufficient to trigger a designated message. Hence, if the designated message is returned, at line 579, the actual control binary sequence (ta) is set equal to the potential control binary sequence (tp), which implements 474 of FIG. 4C. Further, if the designated message is returned, the function call bsrLower( ) is recursively called at line 580, with next_check+1 passed as lower_check and next_check as last_check. Line 580 implements the functionality of 476 and the loop from 476 to 464 of FIG. 4C. If the designated message is not returned, the function call bsrLower( ) is recursively called at line 582, with next_check−1 passed as upper_check. Line 582 implements the functionality of 478 and the loop from 478 to 464 of FIG. 4C.

Generally, the binary search method illustrated by FIGS. 4C and 5C analyzes a range in which a highest lower index may reside and searches the range using a binary search until the highest lower index is identified. The range is the range from lower_check to upper_check, which initially is from j to k. The binary search divides the range into a lower half and an upper half by determining next_check (e.g., which is generally halfway between lower_check and upper_check), and determines whether the highest lower index is present in a given half. In FIGS. 4C and 5C, the upper half is analyzed for the highest lower index by constructing a potential control binary sequence (tp) based on the range from next_check to k and re-running simulation based on the potential control binary sequence (tp). Based on the monotone property, if the designated message is triggered in the re-run of the simulation, the highest lower index is present in the upper half, and the upper half is to be further searched for the highest lower index. The lower half may be discarded as not being necessary to trigger the designated message. Conversely, if the designated message is not triggered in the re-run of the simulation, the highest lower index is not present in the upper half, and the lower half is to be searched for the highest lower index. The various halves are recursively searched until the range from lower_check to upper_check includes no more than one index. The result of such searching is that:

(1) a potential control binary sequence (tp) constructed based on psi and a range from j−1 to k (where j is set in 480) that is used in a simulation triggers the designated message;

(2) a potential control binary sequence (tp) constructed based on psi and a range from j to k (where j is set in 480) that is used in a simulation triggers the designated message; and (3) a potential control binary sequence (tp) constructed based on psi and a range from j+1 to k (where j is set in 480) that is used in a simulation does not trigger the designated message.

To illustrate the functionality of FIGS. 4A through 4C and 5A through 5C, assume an original control binary sequence (e.g., an actual control binary sequence (ta) read at 402) having 10 bits, and of those bits, enabling bits at indexes 0, 5, and 6 are sufficient to trigger a designated message. Reference is made to the pseudocode of FIGS. 5A-5C herein, which indicates which operations of FIGS. 4A-4C are performed. Description of execution of some lines may be omitted for brevity, but such execution is understood to occur.

By operation of lines 503 through 505, initially, j is equal to 0; k is equal to 9; and psi is empty. Execution enters the while loop at line 507 and branches to line 513 because psi is empty. Table 1 below shows values of various variables when line 513 is executed in the first iteration of the while loop.

TABLE 1

| | while iter. | j | k | psi | bsrUpper( ) call | lower_check | upper_check | last_check | next_check | tp | <DesMsg> |
|---|---|---|---|---|---|---|---|---|---|---|---|
| 1 | 1 | 0 | 9 | { } | | | | | | | |
| 2 | 1 | 0 | 9 | { } | 1 | 0 | 9 | 9 | 4 | 0:4 | No |
| 3 | 1 | 0 | 9 | { } | 2 | 5 | 9 | 9 | 7 | 0:7 | Yes |
| 4 | 1 | 0 | 9 | { } | 3 | 5 | 6 | 7 | 5 | 0:5 | No |
| 5 | 1 | 0 | 9 | { } | 4 | 6 | 6 | 7 | 6 | 0:6 | Yes |
| 6 | 1 | 0 | 6 | { } | 5 | 6 | 5 | 6 | — | — | — |

Entry 1 of Table 1 shows the values of j, k, and psi prior to execution of line 513. Entry 2 of Table 1 shows the status of variables when the function call bsrUpper( ) is first called. In the first call, next_check is 4 (calculated at line 564) such that the range with which the potential control binary sequence (tp) is constructed (at line 565) is 0 to 4. Since the potential control binary sequence (tp) does not include the bits of the actual control binary sequence (ta) at indexes 5 and 6, no designated message is triggered when simulation based on the potential control binary sequence (tp) is executed (at line 566). Accordingly, the lower half of the range (0:4) can be excluded from further searching for the lowest upper index, and bsrUpper( ) is recursively called (at line 570) with the lower_check being 5, as shown in entry 3 of Table 1.

In the second call, next_check is 7 (calculated at line 564) such that the range with which the potential control binary sequence (tp) is constructed (at line 565) is 0 to 7. Since the potential control binary sequence (tp) includes the bits of the actual control binary sequence (ta) at indexes 0, 5, and 6, a designated message is triggered when simulation based on the potential control binary sequence (tp) is executed (at line 566). Accordingly, the upper half of the range (8:9) can be excluded from further searching for the lowest upper index, and bsrUpper( ) is recursively called (at line 568) with the upper_check being 6 and last_check being 7, as shown in entry 4 of Table 1.

In the third call, next_check is 5 (calculated at line 564) such that the range with which the potential control binary sequence (tp) is constructed (at line 565) is 0 to 5. Since the potential control binary sequence (tp) does not include the bits of the actual control binary sequence (ta) at indexes 5 and 6, no designated message is triggered when simulation based on the potential control binary sequence (tp) is executed (at line 566). Accordingly, the lower half of the range (5:5) can be excluded from further searching for the lowest upper index, and bsrUpper( ) is recursively called (at line 570) with the lower_check being 6, as shown in entry 5 of Table 1.

In the fourth call, next_check is 6 (calculated at line 564) such that the range with which the potential control binary sequence (tp) is constructed (at line 565) is 0 to 6. Since the potential control binary sequence (tp) includes the bits of the actual control binary sequence (ta) at indexes 0, 5, and 6, a designated message is triggered when simulation based on the potential control binary sequence (tp) is executed (at line 566). Accordingly, the range (7:7) can be excluded from further searching for the lowest upper index, and bsrUpper( ) is recursively called (at line 568) with the upper_check being 5 and last_check being 6, as shown in entry 6 of Table 1.

In the fifth call, lower_check is greater than upper_check, which causes last_check to be returned. Last_check in the fifth call is 6, which causes k to be set equal to 6 at entry 6 of Table 1.

Table 2 below shows values of various variables when line 514 is executed in the first iteration of the while loop.

TABLE 2

| | while iter. | j | k | psi | bsrLower( ) call | lower_check | upper_check | last_check | next_check | tp | <DesMsg> |
|---|---|---|---|---|---|---|---|---|---|---|---|
| 1 | 1 | 0 | 6 | { } | | | | | | | |
| 2 | 1 | 0 | 6 | { } | 1 | 0 | 6 | 0 | 3 | 3:6 | No |
| 3 | 1 | 0 | 6 | { } | 2 | 0 | 2 | 0 | 1 | 1:6 | No |
| 4 | 1 | 0 | 6 | { } | 3 | 0 | 0 | 0 | 0 | 0:6 | Yes |
| 5 | 1 | 0 | 6 | { } | 4 | 1 | 0 | 0 | — | — | — |

Entry 1 of Table 2 shows the values of j, k, and psi prior to execution of line 514. Entry 2 of Table 2 shows the status of variables when the function call bsrLower( ) is first called. In the first call, next_check is 3 (calculated at line 576) such that the range with which the potential control binary sequence (tp) is constructed (at line 577) is 3 to 6. Since the potential control binary sequence (tp) does not include the bit of the actual control binary sequence (ta) at index 0, no designated message is triggered when simulation based on the potential control binary sequence (tp) is executed (at line 578). Accordingly, the upper half of the range (3:6) can be excluded from further searching for the highest lower index, and bsrLower( ) is recursively called (at line 582) with the upper_check being 2, as shown in entry 3 of Table 2.

In the second call, next_check is 1 (calculated at line 576) such that the range with which the potential control binary sequence (tp) is constructed (at line 577) is 1 to 6. Since the potential control binary sequence (tp) does not include the bit of the actual control binary sequence (ta) at index 0, no designated message is triggered when simulation based on the potential control binary sequence (tp) is executed (at line 578). Accordingly, the upper half of the range (1:2) can be excluded from further searching for the highest lower index, and bsrLower( ) is recursively called (at line 582) with the upper_check being 0, as shown in entry 4 of Table 2.

In the third call, next_check is 0 (calculated at line 576) such that the range with which the potential control binary sequence (tp) is constructed (at line 577) is 0 to 6. Since the potential control binary sequence (tp) includes the bits of the actual control binary sequence (ta) at indexes 0, 5, and 6, a designated message is triggered when simulation based on the potential control binary sequence (tp) is executed (at line 578). Accordingly, bsrLower( ) is recursively called (at line 580) with the lower_check being 1 and last_check being 0, as shown in entry 5 of Table 2.

In the fourth call, lower_check is greater than upper_check, which causes last_check to be returned. Last_check in the fourth call is 0, which causes j to be set equal to 0 at entry 5 of Table 2.

Then, in the first iteration of the while loop, psi collects j and k, such that psi is {0, 6} (at line 515). The if statement at line 516 does not cause a break from the while loop. Then, k is decremented to 5 (at line 517); j is incremented to 1 (at line 518); and a second iteration of the while loop begins.

In the second iteration, psi is not empty, so lines 509 and 510 are executed. The potential control binary sequence (tp) that is constructed (at line 509) includes the bits of the actual control binary sequence (ta) at indexes 0 and 6, since psi equals {0, 6}. Since the potential control binary sequence (tp) does not include the bit of the actual control binary sequence (ta) at index 5, no designated message is triggered when simulation based on the potential control binary sequence (tp) is executed (at line 510). Hence, execution of lines 511 and 512 is omitted, and a break (at line 512) from the while loop is not executed.

Table 3 below shows values of various variables when line 513 is executed in the second iteration of the while loop.

TABLE 3

| | while iter. | j | k | psi | bsrUpper( ) call | lower_check | upper_check | last_check | next_check | tp | <DesMsg> |
|---|---|---|---|---|---|---|---|---|---|---|---|
| 1 | 2 | 1 | 5 | {0, 6} | | | | | | | |
| 2 | 2 | 1 | 5 | {0, 6} | 1 | 1 | 5 | 5 | 3 | 1:3, {0, 6} | No |
| 3 | 2 | 1 | 5 | {0, 6} | 2 | 4 | 5 | 5 | 4 | 1:4, {0, 6} | No |
| 4 | 2 | 1 | 5 | {0, 6} | 3 | 5 | 5 | 5 | 5 | 1:5, {0, 6} | Yes |
| 5 | 2 | 1 | 5 | {0, 6} | 4 | 5 | 4 | 5 | — | — | — |

Entry 1 of Table 3 shows the values of j, k, and psi prior to execution of line 513. Entry 2 of Table 3 shows the status of variables when the function call bsrUpper( ) is first called. In the first call, next_check is 3 (calculated at line 564) such that the range with which the potential control binary sequence (tp) is constructed (at line 565) is 1 to 3 (with indexes contained in psi {0, 6}). Since the potential control binary sequence (tp) does not include the bit of the actual control binary sequence (ta) at index 5, no designated message is triggered when simulation based on the potential control binary sequence (tp) is executed (at line 566). Accordingly, the lower half of the range (1:3) can be excluded from further searching for the lowest upper index, and bsrUpper( ) is recursively called (at line 570) with the lower_check being 4, as shown in entry 3 of Table 3.

In the second call, next_check is 4 (calculated at line 564) such that the range with which the potential control binary sequence (tp) is constructed (at line 565) is 1 to 4 (with indexes contained in psi {0, 6}). Since the potential control binary sequence (tp) does not include the bit of the actual control binary sequence (ta) at index 5, no designated message is triggered when simulation based on the potential control binary sequence (tp) is executed (at line 566). Accordingly, the lower half of the range (4:4) can be excluded from further searching for the lowest upper index, and bsrUpper( ) is recursively called (at line 570) with the lower_check being 5, as shown in entry 4 of Table 3.

In the third call, next_check is 5 (calculated at line 564) such that the range with which the potential control binary sequence (tp) is constructed (at line 565) is 1 to 5 (with indexes contained in psi {0, 6}). Since the potential control binary sequence (tp) includes the bits of the actual control binary sequence (ta) at indexes 0, 5, and 6, a designated message is triggered when simulation based on the potential control binary sequence (tp) is executed (at line 566). bsrUpper( ) is recursively called (at line 568) with the upper_check being 4 and last_check being 5, as shown in entry 5 of Table 3.

In the fourth call, lower_check is greater than upper_check, which causes last_check to be returned. Last_check in the fourth call is 5, which causes k to be set equal to 5 at entry 5 of Table 3.

Table 4 below shows values of various variables when line 514 is executed in the second iteration of the while loop.

TABLE 4

| | while iter. | j | k | psi | bsrLower( ) call | lower_check | upper_check | last_check | next_check | tp | <DesMsg> |
|---|---|---|---|---|---|---|---|---|---|---|---|
| 1 | 2 | 1 | 5 | {0, 6} | | | | | | | |
| 2 | 2 | 1 | 5 | {0, 6} | 1 | 1 | 5 | 1 | 3 | 3:5, {0, 6} | Yes |
| 3 | 2 | 1 | 5 | {0, 6} | 2 | 4 | 5 | 3 | 4 | 4:5, {0, 6} | Yes |
| 4 | 2 | 1 | 5 | {0, 6} | 3 | 5 | 5 | 4 | 5 | 5:5, {0, 6} | Yes |
| 5 | 2 | 5 | 5 | {0, 6} | 4 | 5 | 4 | 5 | — | — | — |

Entry 1 of Table 4 shows the values of j, k, and psi prior to execution of line 514. Entry 2 of Table 4 shows the status of variables when the function call bsrLower( ) is first called. In the first call, next_check is 3 (calculated at line 576) such that the range with which the potential control binary sequence (tp) is constructed (at line 577) is 3 to 5 (with indexes contained in psi {0, 6}). Since the potential control binary sequence (tp) includes the bits of the actual control binary sequence (ta) at indexes 0, 5, and 6, a designated message is triggered when simulation based on the potential control binary sequence (tp) is executed (at line 578). Accordingly, the lower half of the range (1:2) can be excluded from further searching for the highest lower index, and bsrLower( ) is recursively called (at line 580) with the lower_check being 4 and last_check being 3, as shown in entry 3 of Table 4.

In the second call, next_check is 4 (calculated at line 576) such that the range with which the potential control binary sequence (tp) is constructed (at line 577) is 4 to 5 (with indexes contained in psi {0, 6}). Since the potential control binary sequence (tp) includes the bits of the actual control binary sequence (ta) at indexes 0, 5, and 6, a designated message is triggered when simulation based on the potential control binary sequence (tp) is executed (at line 578). Accordingly, the range (3:3) can be excluded from further searching for the highest lower index, and bsrLower( ) is recursively called (at line 580) with the lower_check being 5 and last_check being 4, as shown in entry 4 of Table 4.

In the third call, next_check is 5 (calculated at line 576) such that the range with which the potential control binary sequence (tp) is constructed (at line 577) is 5 to 5 (with indexes contained in psi {0, 6}). Since the potential control binary sequence (tp) includes the bits of the actual control binary sequence (ta) at indexes 0, 5, and 6, a designated message is triggered when simulation based on the potential control binary sequence (tp) is executed (at line 578). Accordingly, the range (4:4) can be excluded from further searching for the highest lower index, and bsrLower( ) is recursively called (at line 580) with the lower_check being 5 and last_check being 4, as shown in entry 5 of Table 4.

In the fourth call, lower_check is greater than upper_check, which causes last_check to be returned. Last_check in the fourth call is 5, which causes j to be set equal to 5 at entry 5 of Table 4.

Then, in the second iteration of the while loop, psi collects j and k, such that psi is {0, 5, 6} (at line 515). The if statement at line 516 cause a break from the while loop since j is equal to k. The actual control binary sequence (ta) is then written at line 520.

To further illustrate the functionality of FIGS. 4A through 4C and 5A through 5C, assume an actual control binary sequence (ta) having 10 bits, and of those bits, enabling bits at indexes 0 and 6 are sufficient to trigger a designated message. The execution occurs as described in the previous example through the first iteration of the while loop (e.g., including execution indicated by Tables 1 and 2). In the second iteration, psi is not empty, so lines 509 and 510 are executed. The potential control binary sequence (tp) that is constructed (at line 509) includes the bits of the actual control binary sequence (ta) at indexes 0 and 6, since psi equals {0, 6}. Since the potential control binary sequence (tp) includes the bits of the actual control binary sequence (ta) at indexes 0 and 6, a designated message is triggered when simulation based on the potential control binary sequence (tp) is executed (at line 510). Hence, execution of lines 511 and 512 occurs. The actual control binary sequence (ta) is set equal to the potential control binary sequence (tp) (at line 511), and a break (at line 512) from the while loop is executed. The actual control binary sequence (ta) is then written at line 520.

Various modifications may be made to the method 400 and pseudocode. For example, a linear search, a brute force search, or another search method may be implemented instead of the binary search described above. For example, a linear search may explore all indexes to a present lower index as a lowest upper index and explore all indexes to a present upper index as a highest lower index. A brute force search may construct all $2^N$ permutations of an N number of bits control binary sequence and search those permutations. Further, a binary search may be implemented different from what is described above. For example, a highest lower index may be identified before a lowest upper index is identified.

The binary search method described above may be executed with a run time on the order of N log(N) or less (e.g., O(N log(N))). The execution of the function calls bsrUpper( ) and bsrLower( ) at lines 513 and 514 in FIG. 5A, for example, may be executed with a run time on the order of log(N) or less. The iterations of the while loop beginning at line 507 may be executed with a run time on the order of N. Together, the method implemented by FIG. 5A and corresponding function definitions may be executed with a run time on the order of N log(N) or less (e.g., O(N log(N))). If a linear search method is implemented, the run time may be $N^2$ or less (e.g., $O(N^2)$). If a brute force approach is implemented, the run time may be $2^N$ or less (e.g., $O(2^N)$). Storing a previous result of a re-run of a simulation (e.g., caching a simulation result) may obviate processing for re-running simulation, which may improve run time performance. For example, in the context of the above-described examples, a result of re-running simulation for Entry 5 of Table 1 may be stored (e.g., cached) and accessed for a result of re-running simulation for Entry 4 of Table 2 and re-running simulation for Entry 4 of Table 3. As indicated by these entries of the tables, the potential control binary sequence (tp) is constructed with a range from 0 to 6. Accessing the stored results in Entry 4 for each of Tables 2 and 3 obviates re-running simulation for these entries.

Figure 6:
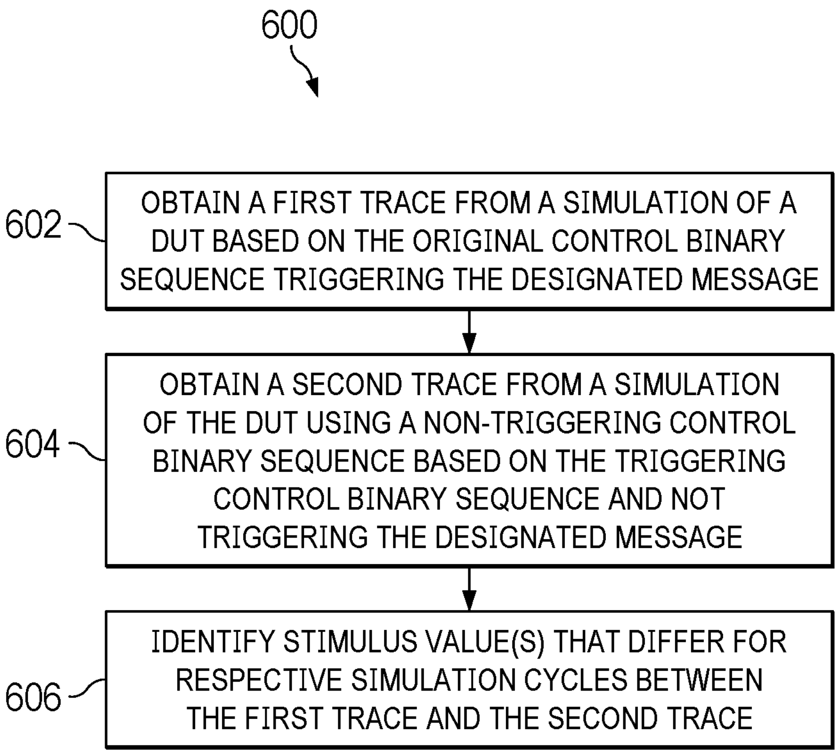
FIG. 6 is a method of localizing one or more constraints that may trigger a designated message according to some examples.

FIG. 6 is a method 600 of localizing one or more constraints that may trigger a designated message according to some examples. At 602, a first trace is obtained from a simulation of a DUT based on the original control binary sequence triggering the designated message. The first trace may be obtained from the original simulation of the DUT or from replaying simulation of the DUT using the original control binary sequence. The first trace includes stimulus values for respective simulation cycles.

At 604, a second trace is obtained from a simulation of the DUT using a non-triggering control binary sequence based on the triggering control binary sequence and not triggering the designated message. The non-triggering control binary sequence is determined based on the triggering control binary sequence. The triggering control binary sequence may be determined by the method 400 of FIGS. 4A through 4C. Other methodologies may be used to obtain a triggering control binary sequence. The non-triggering control binary sequence is the original control binary sequence with bits that correspond to enabled bits in the triggering control binary sequence being disabled bits. The enabled bits of the triggering control binary sequence may be used to mask corresponding bits of the original control binary sequence to be disabled bits. The non-triggering control binary sequence is used during the simulation of the DUT to selectively enable restoring solving steps of the constraint random stimulus generator for each constraint problem corresponding to an enabled bit of the non-triggering control binary sequence and disable restoring the solving steps for each constraint problem corresponding to a disabled bit of the non-triggering control binary sequence. Selectively enabling and disabling the solving steps according to the non-triggering control binary sequence may cause the designated message to not be triggered from simulating the DUT. The second trace includes stimulus values for respective simulation cycles.

At 606, one or more stimulus values that differ for respective simulation cycles between the first trace and the second trace are identified. A trace may include values for many stimuli for a given simulation cycle. When respective values of a same stimulus in a same simulation cycle of the first trace and the second trace differ, the stimulus may indicate that a constraint affecting that stimulus is a cause of the designated message generated by the simulation of the DUT. The number of stimuli identified as a result of the method 600 may be reduced, which may facilitate faster debugging of constraints.

Two use cases illustrate the effectiveness of implementing a constraint debugger 134 as described above. A first use case included 110 random problem instances in a failing trace. The methods 400, 600 described above were implemented to identify a triggering control binary sequence that indicates a reduced portion of a trace and to identify one or more constraints that may trigger a designated message. As a benchmark, an upper bound of the run time for identifying a triggering control binary sequence according to the binary search method of FIGS. 4A-4C is 110*log(110) runs (e.g., for simulation re-run), which is approximately 746 runs. In this example, 16 runs were able to determine the triggering control binary sequence. Among those 16 runs, a failure message was observed in 11 runs, and no failure message was observed in 5 runs. The 11 runs in which a failure message was observed averaged 2.7 seconds per run, and the 5 runs in which no failure message was observed averaged 20 seconds. The total run time to determine the triggering control binary sequence was 129 seconds. Comparatively, an experienced test engineer may take two to three days to identify a root cause of the failure message.

In this use case, the number of enabled bits in the triggering control binary sequence was reduced from 110 (e.g., corresponding to the number of random problems) to 1 by implementing the binary search method of FIGS. 4A-4C. Further, the number of different values of stimuli between a failing trace (simulated based on the triggering control binary sequence) and a passing trace (simulated without biasing) was reduced from 94 to 7. The reduced set of value differences permitted the root cause of the failure to be pinpointed more easily.

A second use case included 331 random problem instances in a failing trace. The methods 400, 600 described above were implemented to identify a triggering control binary sequence that indicates a reduced portion of a trace and to identify one or more constraints that may trigger a designated message. As a benchmark, an upper bound of the run time for identifying a triggering control binary sequence according to the binary search method of FIGS. 4A-4C is 331*log(331) runs (e.g., for simulation re-run), which is approximately 2,771 runs. In this example, 20 runs were able to determine the triggering control binary sequence. Among those 20 runs, a failure message was observed in 12 runs, and no failure message was observed in 8 runs. The 12 runs in which a failure message was observed averaged 7 seconds per run, and the 8 runs in which no failure message was observed averaged 7 seconds. The total run time to determine the triggering control binary sequence was 140 seconds.

In this use case, the number of enabled bits in the actual control binary sequence (ta) was reduced from 331 (e.g., corresponding to the number of random problems) to 1 by implementing the binary search method of FIGS. 4A-4C. Further, the number of different values of stimuli between a failing trace (simulated based on the triggering control binary sequence) and a passing trace (simulated without biasing) was reduced from 251 to 6. The reduced set of value differences permitted the root cause of the failure to be pinpointed more easily.

Figure 7:
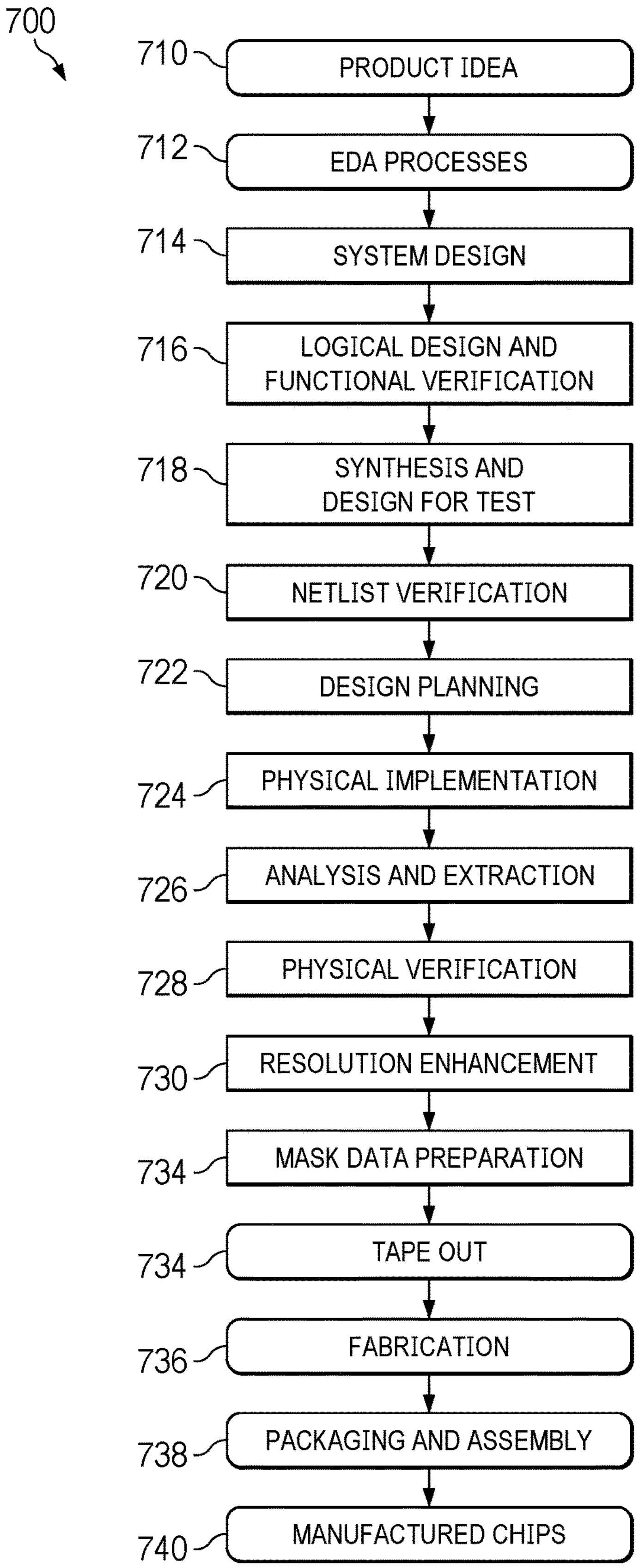
FIG. 7 depicts a flowchart of various processes used during the design and manufacture of an integrated circuit in accordance with some examples.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language (HDL) such as VHDL, Verilog, System Verilog, SystemC, MyHDL or Open Vera. The HDL description can be transformed to a logic-level register transfer level (RTL) description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 7. The processes described by be enabled by EDA products (or EDA systems).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification. Functional verification may include any of the methods 300, 400, 600 described above.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
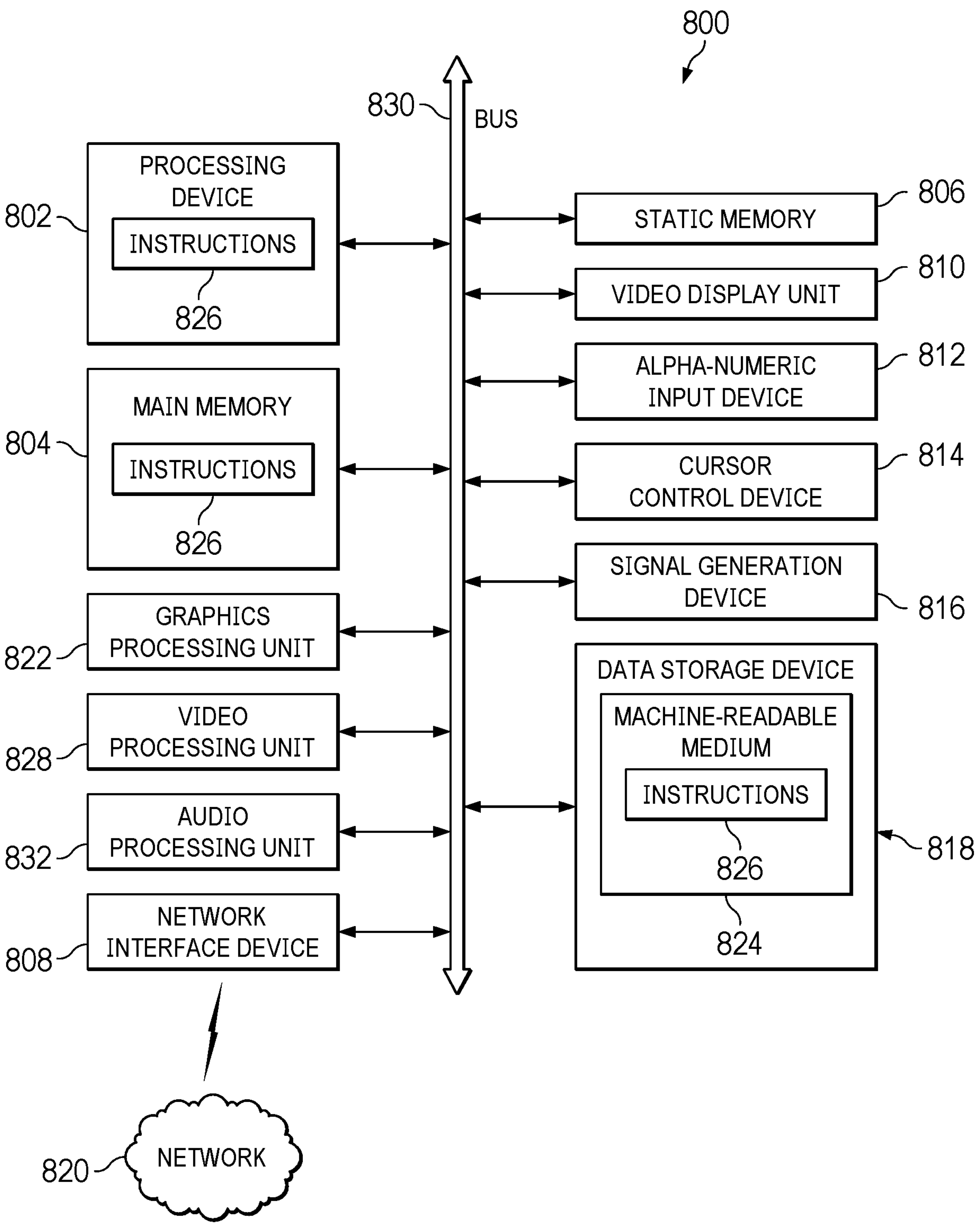
FIG. 8 depicts a diagram of an example computer system in which some examples may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable storage medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a non-transitory computer-readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable storage medium having stored thereon instructions, which may be used to program a computer system (or other electronic devices) to perform a process according to the present disclosure. A machine-readable storage medium includes any mechanism for storing information in a form readable by a machine (e.g., a computer). For example, a machine-readable (e.g., a computer-readable) storage medium includes a machine-readable (e.g., a computer-readable) storage medium such as a read only memory (ROM), random access memory (RAM), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:

obtaining a control binary sequence that was determined during simulating a design under test (DUT), wherein simulating the DUT was based on using a constraint random stimulus generator and a coverage biaser biasing the constraint random stimulus generator, the control binary sequence including first enabled bits that correspond to respective constraint problems solved by the constraint random stimulus generator and biased by the coverage biaser and from which a designated message was triggered during the simulating the DUT;

constructing, by one or more processors, a reduced control binary sequence that has second enabled bits that are a subset of the first enabled bits;

obtaining a simulation result generated by re-simulating the DUT, re-simulating the DUT including selectively, for each constraint problem of the constraint problems, restoring solving steps of the constraint random stimulus generator for the respective constraint problem that were performed during the simulating the DUT when a corresponding bit of the reduced control binary sequence is an enabled bit of the second enabled bits;

determining whether the simulation result includes the designated message; and assigning the reduced control binary sequence as a triggering control binary sequence that triggered the designated message when the simulation result includes the designated message.

2. The method of claim 1, wherein constructing the reduced control binary sequence, obtaining the simulation result, determining whether the simulation result includes the designated message, and assigning the reduced control binary sequence when the simulation result includes the designated message are performed iteratively.

3. The method of claim 2, wherein obtaining the simulation result generated by re-simulating the DUT includes, for a respective iteration:

retrieving from storage the simulation result when the simulation result corresponding to a same reduced control binary sequence as the reduced control binary sequence was previously stored in the storage;

when the simulation result corresponding to the same reduced control binary sequence as the reduced control binary sequence was not previously stored in the storage:

re-simulating the DUT based on the reduced control binary sequence to obtain the simulation result; and storing in the storage the simulation result corresponding to the reduced control binary sequence.

4. The method of claim 1 further comprising:

storing, for each constraint problem of the constraint problems to be solved by the constraint random stimulus generator during the simulation of the DUT, a state of the constraint random stimulus generator at an initial time of the respective constraint problem;

simulating the DUT using stimulus values generated by the constraint random stimulus generator biased by the coverage biaser, the constraint random stimulus generator generating the stimulus values based on the respective constraint problems and based on seed values determined by the respective states of the constraint random stimulus generator at the respective initial times of the respective constraint problems;

restoring the respective stored state to the constraint random stimulus generator prior to and for each constraint problem of the constraint problems to be solved by the constraint random stimulus generator during a re-simulation of the DUT; and re-simulating the DUT based on the reduced control binary sequence, biasing of the constraint random stimulus generator by the coverage biaser being selectively enabled or disabled for the respective constraint problems based on the reduced control binary sequence.

5. The method of claim 1 further comprising:

storing, for each constraint problem of the constraint problems to be solved by the constraint random stimulus generator during the simulation of the DUT, a state of the constraint random stimulus generator at an initial time of the respective constraint problem;

simulating the DUT using stimulus values generated by the constraint random stimulus generator biased by the coverage biaser, the constraint random stimulus generator generating the stimulus values based on the respective constraint problems and based on seed values determined by the respective states of the constraint random stimulus generator at the respective initial times of the respective constraint problems;

selectively restoring the respective stored state to the constraint random stimulus generator, prior to solving a respective constraint problem of the constraint problems for re-simulating the DUT, based on the reduced control binary sequence for each constraint problem of the constraint problems to be solved by the constraint random stimulus generator during the re-simulating the DUT; and re-simulating the DUT based on the constraint random stimulus generator being biased by the coverage biaser for each constraint problem of the constraint problems to be solved by the constraint random stimulus generator during the re-simulating the DUT.

6. The method of claim 1 further comprising performing a binary search to identify the second enabled bits.

7. The method of claim 1, wherein constructing the reduced control binary sequence includes:

initiate an index range with an upper index and a lower index;

iteratively until (A) an index set is determined such that (i) each enabled bit of the second enabled bits corresponds to a respective enabled bit of the first enabled bits at a respective index in the index set and (ii) the simulation result generated by re-simulating the DUT based on the reduced control binary sequence includes the designated message, or (B) a termination condition is reached:

determining a lowest upper index in the index range and a highest lower index in the index range, wherein:

the designated message is triggered by a re-simulation of the DUT based on a first control binary sequence, the first control binary sequence having third enabled bits, each enabled bit of the third enabled bits corresponding to a respective enabled bit of the first enabled bits at a respective index in the index set or at a respective index in a range from the highest lower index to the lowest upper index;

the designated message is not triggered by a re-simulation of the DUT based on a second control binary sequence, the second control binary sequence having fourth enabled bits, each enabled bit of the fourth enabled bits corresponding to a respective enabled bit of the first enabled bits at a respective index in the index set or at a respective index in a range from the highest lower index plus one to the lowest upper index; and the designated message is not triggered by a re-simulation of the DUT based on a third control binary sequence, the third control binary sequence having fifth enabled bits, each enabled bit of the fifth enabled bits corresponding to a respective enabled bit of the first enabled bits at a respective index in the index set or at a respective index in a range from the highest lower index to the lowest upper index minus one; and collecting the lowest upper index and the highest lower index in the index set; and setting the upper index to be one less than the lowest upper index and the lower index to be one more than the highest lower index.

8. The method of claim 1, wherein the designated message includes a failure message or a message defined by a regular expression.

9. The method of claim 1 further comprising:

obtaining a first trace resulting from simulating the DUT based on the control binary sequence triggering the designated message;

obtaining a second trace resulting from simulating the DUT using a non-triggering control binary sequence based on the triggering control binary sequence and not triggering the designated message, the non-triggering control binary sequence being the control binary sequence except with disabled bits corresponding to enabled bits of the triggering control binary sequence; and identifying a stimulus value that differs between the first trace and the second trace for a respective simulation cycle.

10. A non-transitory computer-readable medium comprising stored instructions, which when executed by one or more processors, cause the one or more processors to:

obtain a control binary sequence that was determined during simulating a design under test (DUT), wherein simulating the DUT was based on using a constraint random stimulus generator and a coverage biaser biasing the constraint random stimulus generator, the control binary sequence including first enabled bits that correspond to respective constraint problems solved by the constraint random stimulus generator and biased by the coverage biaser and from which a designated message was triggered during the simulating the DUT;

construct a reduced control binary sequence that has second enabled bits that are a subset of the first enabled bits;

obtain a simulation result generated by re-simulating the DUT, re-simulating the DUT including selectively, for each constraint problem of the constraint problems, restoring solving steps of the constraint random stimulus generator for the respective constraint problem that were performed during the simulating the DUT when a corresponding bit of the reduced control binary sequence is an enabled bit of the second enabled bits;

determine whether the simulation result includes the designated message; and assign the reduced control binary sequence as a triggering control binary sequence that triggered the designated message when the simulation result includes the designated message.

11. The non-transitory computer-readable medium of claim 10, wherein:

constructing the reduced control binary sequence, obtaining the simulation result, determining whether the simulation result includes the designated message, and assigning the reduced control binary sequence when the simulation result includes the designated message are performed iteratively; and the instructions, which when executed by the one or more processors, that cause the one or more processors to obtain the simulation result generated by re-simulating the DUT include instructions, which when executed by the one or more processors, cause the one or more processors to, for a respective iteration:

retrieve from storage the simulation result when the simulation result corresponding to a same reduced control binary sequence as the reduced control binary sequence was previously stored in the storage;

when the simulation result corresponding to the same reduced control binary sequence as the reduced control binary sequence was not previously stored in the storage:

re-simulate the DUT based on the reduced control binary sequence to obtain the simulation result; and store in the storage the simulation result corresponding to the reduced control binary sequence.

12. The non-transitory computer-readable medium of claim 10, wherein the instructions, which when executed by the one or more processors, further cause the one or more processors to:

store, for each constraint problem of the constraint problems to be solved by the constraint random stimulus generator during the simulation of the DUT, a state of the constraint random stimulus generator at an initial time of the respective constraint problem;

simulate the DUT using stimulus values generated by the constraint random stimulus generator biased by the coverage biaser, the constraint random stimulus generator generating the stimulus values based on the respective constraint problems and based on seed values determined by the respective states of the constraint random stimulus generator at the respective initial times of the respective constraint problems;

restore the respective stored state to the constraint random stimulus generator prior to and for each constraint problem of the constraint problems to be solved by the constraint random stimulus generator during a re-simulation of the DUT; and re-simulate the DUT based on the reduced control binary sequence, biasing of the constraint random stimulus generator by the coverage biaser being selectively enabled or disabled for the respective constraint problems based on the reduced control binary sequence.

13. The non-transitory computer-readable medium of claim 10, wherein the instructions, which when executed by the one or more processors, further cause the one or more processors to:

store, for each constraint problem of the constraint problems to be solved by the constraint random stimulus generator during the simulation of the DUT, a state of the constraint random stimulus generator at an initial time of the respective constraint problem;

simulate the DUT using stimulus values generated by the constraint random stimulus generator biased by the coverage biaser, the constraint random stimulus generator generating the stimulus values based on the respective constraint problems and based on seed values determined by the respective states of the constraint random stimulus generator at the respective initial times of the respective constraint problems;

selectively restore the respective stored state to the constraint random stimulus generator, prior to solving a respective constraint problem of the constraint problems for re-simulating the DUT, based on the reduced control binary sequence for each constraint problem of the constraint problems to be solved by the constraint random stimulus generator during the re-simulating the DUT; and re-simulate the DUT based on the constraint random stimulus generator being biased by the coverage biaser for each constraint problem of the constraint problems to be solved by the constraint random stimulus generator during the re-simulating the DUT.

14. The non-transitory computer-readable medium of claim 10, wherein the instructions, which when executed by the one or more processors, that cause the one or more processors to construct the reduced control binary sequence include instructions, which when executed by the one or more processors, cause the one or more processors to:

initiate an index range with an upper index and a lower index;

iteratively until (A) an index set is determined such that (i) each enabled bit of the second enabled bits corresponds to a respective enabled bit of the first enabled bits at a respective index in the index set and (ii) the simulation result generated by re-simulating the DUT based on the reduced control binary sequence includes the designated message, or (B) a termination condition is reached:

determine a lowest upper index in the index range and a highest lower index in the index range, wherein:

the designated message is triggered by a re-simulation of the DUT based on a first control binary sequence, the first control binary sequence having third enabled bits, each enabled bit of the third enabled bits corresponding to a respective enabled bit of the first enabled bits at a respective index in the index set or at a respective index in a range from the highest lower index to the lowest upper index;

the designated message is not triggered by a re-simulation of the DUT based on a second control binary sequence, the second control binary sequence having fourth enabled bits, each enabled bit of the fourth enabled bits corresponding to a respective enabled bit of the first enabled bits at a respective index in the index set or at a respective index in a range from the highest lower index plus one to the lowest upper index; and the designated message is not triggered by a re-simulation of the DUT based on a third control binary sequence, the third control binary sequence having fifth enabled bits, each enabled bit of the fifth enabled bits corresponding to a respective enabled bit of the first enabled bits at a respective index in the index set or at a respective index in a range from the highest lower index to the lowest upper index minus one; and collect the lowest upper index and the highest lower index in the index set; and set the upper index to be one less than the lowest upper index and the lower index to be one more than the highest lower index.

15. The non-transitory computer-readable medium of claim 10, wherein the instructions, which when executed by the one or more processors, further cause the one or more processors to:

obtain a first trace resulting from simulating the DUT based on the control binary sequence triggering the designated message;

obtain a second trace resulting from simulating the DUT using a non-triggering control binary sequence based on the triggering control binary sequence and not triggering the designated message, the non-triggering control binary sequence being the control binary sequence except with disabled bits corresponding to enabled bits of the triggering control binary sequence; and identify a stimulus value that differs between the first trace and the second trace for a respective simulation cycle.

16. A non-transitory computer-readable medium comprising stored instructions, which when executed by one or more processors, cause the one or more processors to:

obtain an original control binary sequence that was generated during simulating a design under test (DUT), wherein simulating the DUT was based on stimulus values generated using a constraint random stimulus generator and a coverage biaser biasing the constraint random stimulus generator, simulating the DUT generating the original control binary sequence, the original control binary sequence including first enabled bits that correspond to respective constraint problems solved by the constraint random stimulus generator and from which a designated message was triggered during the simulating the DUT;

initiate an index range with an upper index and a lower index; and iteratively until (A) an index set is determined such that re-simulating the DUT based on a reduced control binary sequence triggers the designated message, the reduced control binary sequence having second enabled bits, each enabled bit of the second enabled bits corresponding to a respective enabled bit of the first enabled bits at a respective index in the index set, or (B) a termination condition is reached:

determine a lowest upper index in the index range and a highest lower index in the index range, wherein the designated message is triggered by a re-simulation of the DUT based on a first control binary sequence, the first control binary sequence having third enabled bits, each enabled bit of the third enabled bits corresponding to a respective enabled bit of the first enabled bits at a respective index in the index set or at a respective index in a range from the highest lower index to the lowest upper index;

collect the lowest upper index and the highest lower index in the index set; and set the upper index to be one less than the lowest upper index and the lower index to be one more than the highest lower index.

17. The non-transitory computer-readable medium of claim 16, wherein:

the designated message is not triggered by a re-simulation of the DUT based on a second control binary sequence, the second control binary sequence having fourth enabled bits, each enabled bit of the fourth enabled bits corresponding to a respective enabled bit of the first enabled bits at a respective index in the index set or at a respective index in a range from the highest lower index plus one to the lowest upper index; and the designated message is not triggered by a re-simulation of the DUT based on a third control binary sequence, the third control binary sequence having fifth enabled bits, each enabled bit of the fifth enabled bits corresponding to a respective enabled bit of the first enabled bits at a respective index in the index set or at a respective index in a range from the highest lower index to the lowest upper index minus one.

18. The non-transitory computer-readable medium of claim 16, wherein the instructions, which when executed by the one or more processors, that cause the one or more processors to determine the lowest upper index in the index range and the highest lower index in the index range further cause the one or more processors to:

determine whether the designated message is triggered by a re-simulation of the DUT based on a given control binary sequence, determining whether the designated message is triggered comprising:

determining whether a first result of a re-simulation of the DUT based on a same control binary sequence as the given control binary sequence is stored in storage;

when the first result is stored in the storage, reading the first result from the storage, the first result indicating whether the designated message is triggered by the re-simulation of the DUT based on the given control binary sequence; and when the first result is not stored in the storage:

re-simulating the DUT based on the given control binary sequence; and storing a second result of the re-simulation of the DUT based on the given control binary sequence in the storage, the second result indicating whether the designated message is triggered by the re-simulation of the DUT based on the given control binary sequence.

19. The non-transitory computer-readable medium of claim 16, wherein the instructions, which when executed by the one or more processors, further cause the one or more processors to:

store in storage, for each constraint problem of the constraint problems to be solved by the constraint random stimulus generator during the simulation, a state of the constraint random stimulus generator at an initial time of the respective constraint problem;

simulate the DUT using the stimulus values generated by the constraint random stimulus generator biased by the coverage biaser, the constraint random stimulus generator generating the stimulus values based on the respective constraint problems and based on seed values determined by the respective states of the constraint random stimulus generator at the respective initial times of the respective constraint problems;

restore the respective stored state to the constraint random stimulus generator prior to re-simulating the DUT for each constraint problem of the constraint problems to be solved by the constraint random stimulus generator during a re-simulation; and re-simulate the DUT based on the reduced control binary sequence, biasing of the constraint random stimulus generator by the coverage biaser being selectively enabled or disabled for the respective constraint problems based on the reduced control binary sequence.

20. The non-transitory computer-readable medium of claim 16, wherein the instructions, which when executed by the one or more processors, further cause the one or more processors to:

obtain a first trace resulting from simulating the DUT based on the original control binary sequence triggering the designated message;

obtain a second trace resulting from simulating the DUT using a non-triggering control binary sequence based on the triggering control binary sequence and not triggering the designated message, the non-triggering control binary sequence being the original control binary sequence except with disabled bits corresponding to enabled bits of the triggering control binary sequence; and identify a stimulus value that differs between the first trace and the second trace for a respective simulation cycle.

* * * * *